United States Patent
Ono et al.

(10) Patent No.: US 6,334,199 B1
(45) Date of Patent: Dec. 25, 2001

(54) METHOD OF GENERATING TEST PATTERNS FOR A LOGIC CIRCUIT, A SYSTEM PERFORMING THE METHOD, AND A COMPUTER READABLE MEDIUM INSTRUCTING THE SYSTEM TO PERFORM THE METHOD

(75) Inventors: Toshinobu Ono; Tamaki Toumiya, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/236,903

(22) Filed: Jan. 26, 1999

(30) Foreign Application Priority Data

Jan. 28, 1998 (JP) .................................. 10-015921
Feb. 19, 1998 (JP) .................................. 10-037223

(51) Int. Cl.[7] .................................................. G01R 31/28
(52) U.S. Cl. ........................................... 714/728; 714/739
(58) Field of Search ..................................... 714/724, 725; 724/726–745; 324/73; 326/16, 21

(56) References Cited

U.S. PATENT DOCUMENTS 4,366,393 * 12/1982 Kasuya ..................................... 326/16
5,513,118 * 4/1996 Dey et al. ........................ 395/500.19
6,148,425 * 11/2000 Bhawmik et al. .................... 714/726

FOREIGN PATENT DOCUMENTS

| 61-240173 | 10/1986 | (JP) | ................................ G01R/31/28 |
| 3-29870 | 2/1991 | (JP) | ................................ G01R/31/28 |
| 5-142306 | 6/1993 | (JP) | ................................ G01R/31/28 |
| 7-234266 | 9/1995 | (JP) | ................................ G01R/31/28 |

* cited by examiner

Primary Examiner—Albert Decady
Assistant Examiner—Emeka J. Amanze
(74) Attorney, Agent, or Firm—Young & Thompson

(57) ABSTRACT

In a method of test pattern generation for logic circuits, a whole circuit is divided into a plurality of partial circuits for test pattern generation by distributed-processing. ATG (Algorithmic Test Generation) process is performed per each of the partial circuits based on the result of RTG (Random Test Generation) process. Also disclosed are a test pattern generation system performing the method, and computer readable media having program for the test pattern generation system to perform the method.

27 Claims, 20 Drawing Sheets

METHOD OF GENERATING TEST PATTERNS FOR A LOGIC CIRCUIT, A SYSTEM PERFORMING THE METHOD, AND A COMPUTER READABLE MEDIUM INSTRUCTING THE SYSTEM TO PERFORM THE METHOD

BACKGROUND OF THE INVENTION

1. Field of the Invention

The present invention relates to a method of generating test patterns for a logic circuit, a system performing the method, and a computer readable medium instructing the system to perform the method; and especially relates to test pattern generation that divides a whole logic circuit into a plurality of partial circuits and generates test patterns for each of the partial circuits.

2. Related Art

Automatic Test Generation is an approach for defining faults that may occur in a circuit and for generating a test pattern automatically to detect the defined faults.

First, a random pattern used to detect the faults defined for the circuit is generated, and the generated random pattern is used to execute fault simulation for all the faults defined for the circuit.

Next, the pattern validated by fault simulation is used as a test pattern. A further random test pattern is generated such that the already detected faults will be no longer subjected to continued fault detection.

Once the number of faults detected by the random test pattern generation has decreased, a test pattern is generated by the ATG (Algorithmic Test Generation) process that algorithmically generates a test pattern while referencing the construction of the circuit. This time, the previously detected faults also will no longer be subjected to fault detection.

This kind of conventional method is described in Japanese Patent Application Lail-Open No. 61-240173. The generation method described in the above publication uses a test pattern to detect faults having occurred in the whole of a logic circuit (hereinafter described as whole circuit). That is, the above generation method generates random numbers in a number corresponding to the input terminals of the whole circuit. Additionally, the above generation method generates a first test pattern using the generated random numbers.

In the ensuing fault detection for the logic circuit, the above first test pattern is applied to the input terminals of the above whole circuit. When fault detection using the first test pattern is saturated, the above generation method generates a second test pattern by using an algorithm such as D-algorithm for detecting a specific fault in the whole circuit. Faults which cannot be detected by the first test pattern are thereby detected using the second test pattern.

Thus, in the fault detection for a logic circuit, the use of test patterns generated in various ways allows an accurate fault detection.

To generate such test patterns two methods can be used: either a target fault detection rate (described below) is present so that processing is terminated when the fault detection rate reaches the set value; or the target fault detection rate is not set.

To calculate the fault detection rate, the following method can be used.

(1) (Fault detection rate)=(number of faults detected)/ (total number of faults)

(2) (Fault detection rate)=(number of faults detected)/{ (total number of faults)−(number of faults determined to be undetectable)}

(3) (Fault detection rate)={(number of faults detected)+ (number of faults determined to be undetectable)}/ (total number of faults)

The prior art described in the above publication has the following problems. That is, if the scale of a logic circuit, the object of fault detection, is large, the above first and second test patterns become complex. This causes a problem that it takes a long time to generate the first and second test patterns to satisfy a target fault detection rate.

Furthermore, since the first and second test patterns become large as they become complex, a storage device of a large capacity is required, for instance, for saving the first and second test patterns during the generation processes of these patterns, causing a restriction on the handling of the first and second patterns.

Still further, it is difficult to distribute the generated pattern to a plurality of processors. That is, the prior art method is difficult to apply to a distributed-processing test pattern generation system.

SUMMARY OF THE INVENTION

An object of the invention is to provide a novel method of generating test patterns for a logic circuit, a novel system performing the method, and a novel computer readable medium instructing the system to perform the method.

A further object of the invention is to provide a method of test pattern generation amendable to distributed processing.

These and other objects of the present invention will be apparent to those of skill in the art from the appended claims when read in light of the following specification and accompanying figures.

DESCRIPTION OF THE PREFERRED EMBODIMENTS

A method of test pattern generation for a logic circuit by this invention is a method for distributing the test pattern generation process by dividing a circuit into partial circuits and carrying out test pattern generation for each of the divided partial circuits.

Generally speaking, any dividing method can be used for the partial circuits as long as it allows the partial circuits to be processed independently (the processing order can be set arbitrarily).

For example, all output terminals may be divided into groups and all the elements relating to one group of output terminals are considered to be one partial circuit. In this method, however, the same element that affects a plurality of output terminals may be included in a plurality of partial circuits. In this case, the same fault that is defined for the input and output of the element included in the plurality of partial circuits is included in each of the plurality of partial circuits.

In other circuit dividing methods, the same fault may also be included in a plurality of partial circuits. The circuit is divided in such a way that the number of partial circuits is larger than that of the number of processors used. Test pattern generation for a partial circuit is assigned to a plurality of processors, and a processor for which ATG process has been completed is assigned ATG processing for the subsequent partial circuit.

The first embodiment of the present invention is described below with reference to FIGS. 1–8.

Figure 1:
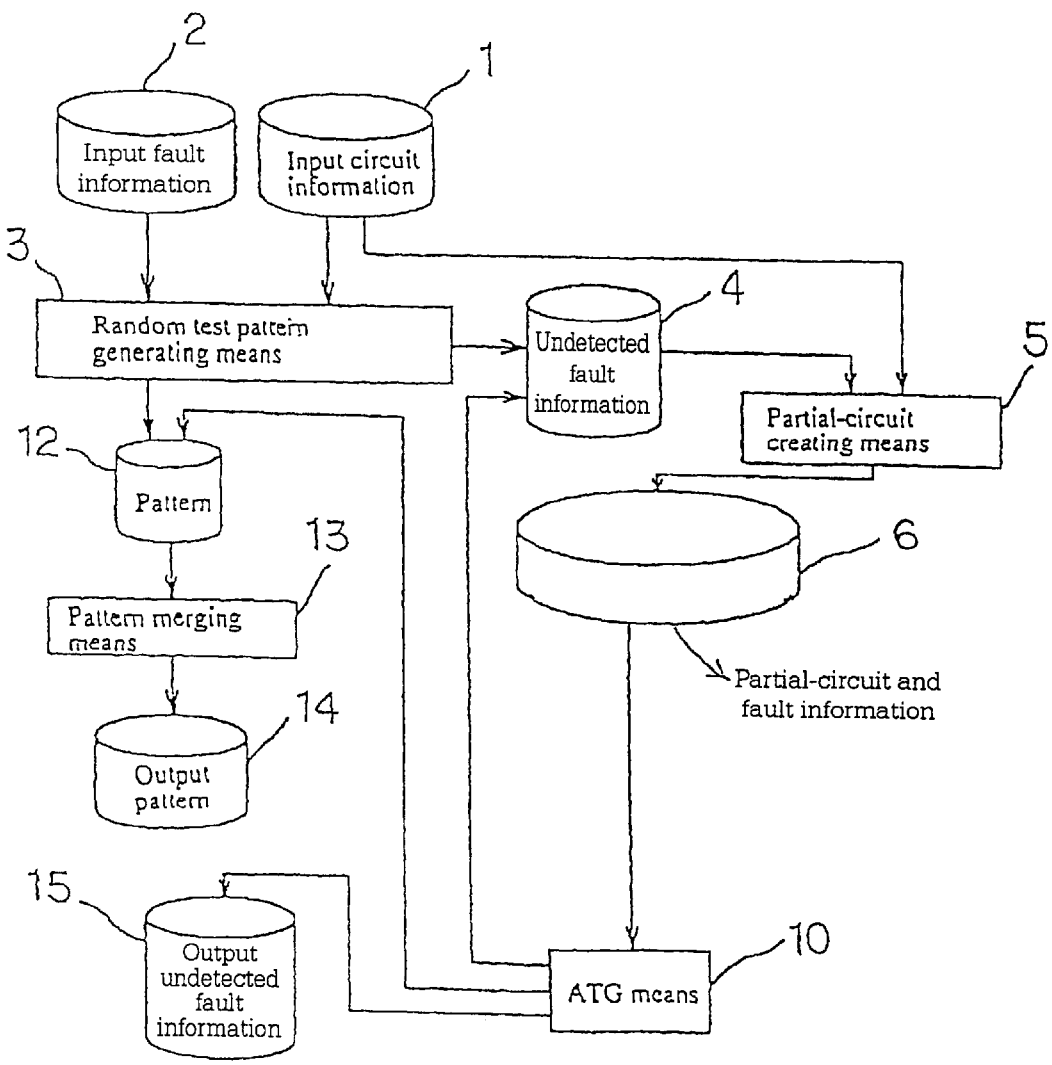
FIG. 1 is a block diagram showing a first embodiment of a test pattern generation system according to this invention.

As shown in FIG. 1, the first embodiment comprises a random test pattern generating means 3, a partial circuit creating means 5, an ATG means 10, and a pattern merging means 13.

The random test pattern generating means 3 generates a random pattern by using random numbers. Then, the random test pattern generating means 3 executes fault simulation to detect faults in a circuit based on the generated random pattern, input circuit information 1 and input fault information 2. The input circuit information 1 contains information about all the elements included in the circuit for test pattern generation and information about the connections among the elements. The input fault information 2 contains information about faults that can be defined for the circuit for test pattern generation. The random test pattern generating means 3 generates a test pattern used to detect faults in the circuit based on faults detected by the fault simulation, and outputs the generated test pattern as a pattern 12. The random test pattern generating means 3 also outputs undetected fault information 4, which is information on faults that have not been detected by the fault simulation.

A partial circuit creating means 5 divides the circuit for ATG processing based on the input circuit information 1 to generate partial circuits. The partial circuit creating means 5 generates information on faults that can be detected in the partial circuits based on the generated partial circuits and the undetected fault information 4 outputted from the random test pattern generating means 3. The partial circuit creating means 5 outputs this information as partial-circuit and fault information 6.

An ATG means 10 generates automatically a test pattern used to detect faults in the circuit based on the partial-circuit and fault information 6 outputted from the partial-circuit creating means 5. The ATG means 10 then outputs the generated test pattern as a further pattern 12.

If the defect detection rate has not reached a specified value, the ATG means 10 outputs as the undetected defect information 4, information on faults that have not been used to generate the test pattern. On the other hand, if the fault detection rate has reached the specified value, the ATG means 10 outputs as the output undetected fault information 15, information on faults that have not been used to generate the test pattern.

A pattern merge means 13 merges the test patterns 12, generated by the random test pattern generating means 3 and the ATG means 10, in order to output them as an output pattern 14.

Figure 2:
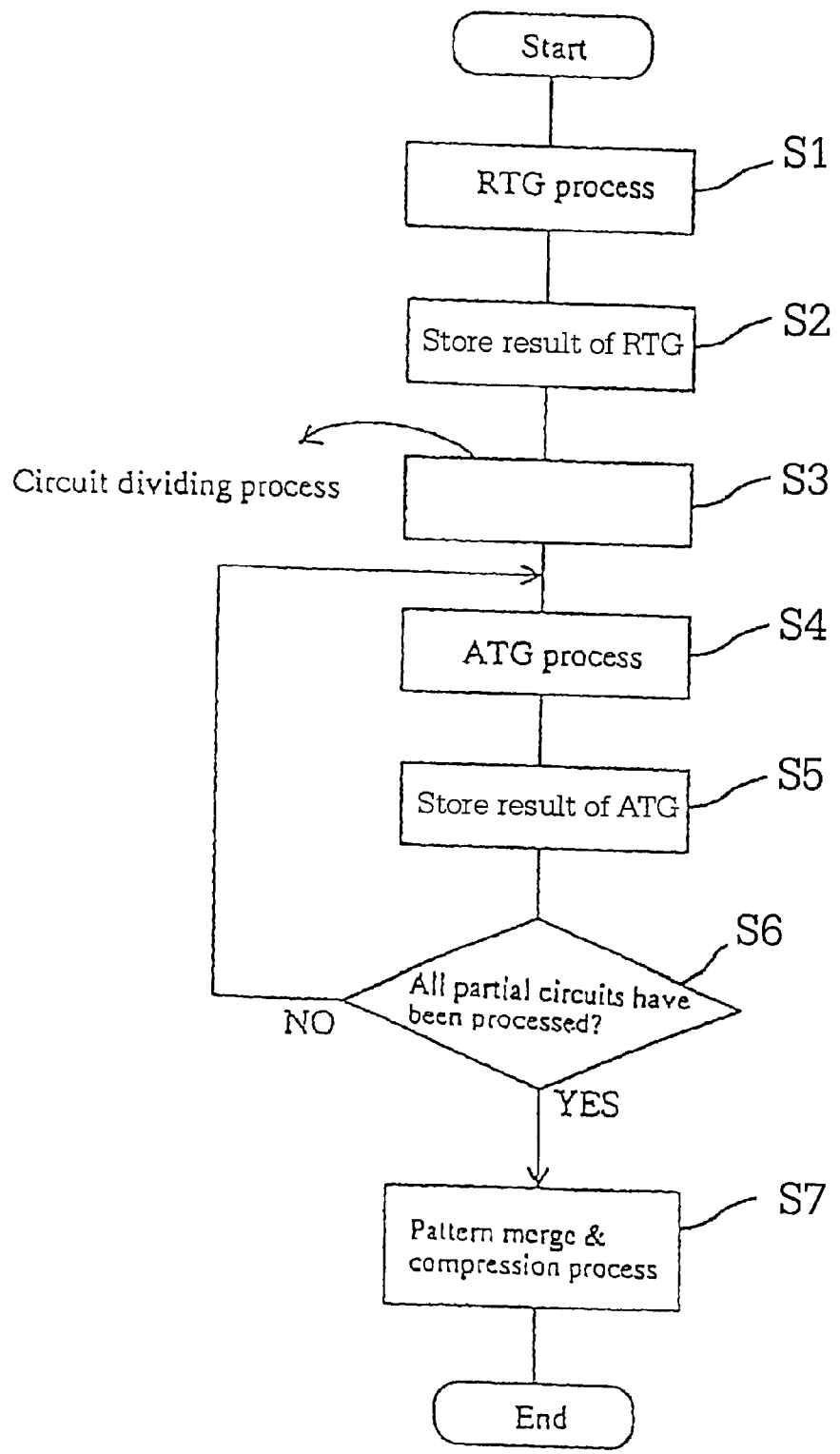
FIG. 2 is a general flowchart showing a first embodiment of a method for generating test patterns according to this invention.

FIG. 2 is a general flowchart showing the method of the first embodiment. At first, a RTG (Random Test Generation) process is performed (step S1). The RTG process is a method for generating a test pattern by using random numbers. When the step S1 is terminated, the results of step S1 are stored in the memory (step S2). After step S2, the division process of the whole circuit is performed (step S3). The circuit dividing process is a process of extracting a plurality of partial circuits. After step S3, an ATG (Algorithmic Test Generation) process is performed (step S4). The ATG process is a method for generating a test pattern by using a special algorithm for detecting faults one by one, which cannot be examined by the test pattern by the RTG process. When the step S4 is terminated, the results of step S4 are stored in the memory (step S5).

After step S5, it is determined whether the process in steps S4 to S5 has been completed for all the partial circuits (step S6). As a result of this determination, if there is any partial circuit that has not been processed yet, the process is returned to step S4. If all partial circuits have been processed, in step S6, then the merge & compression process for the test patterns stored in steps S2 and S5 are performed (step S7).

Figure 3:
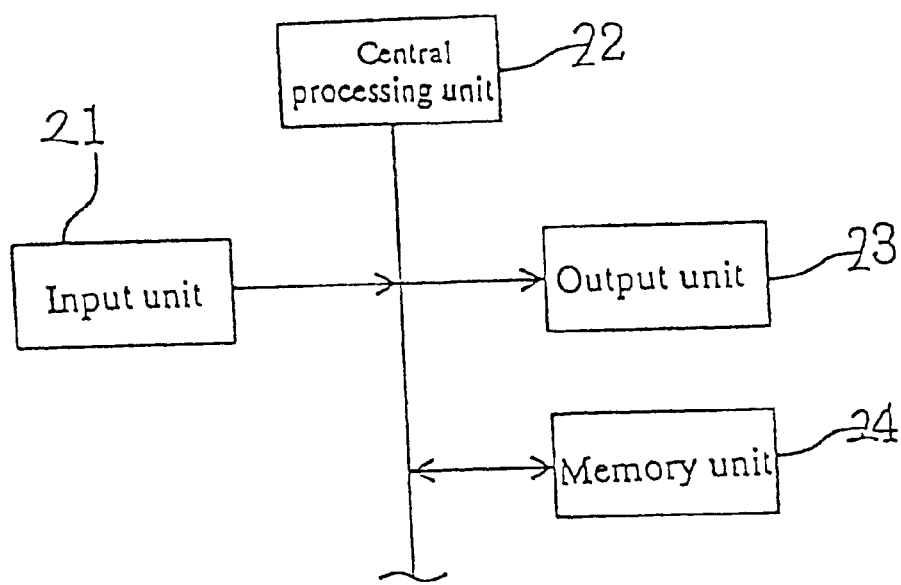
FIG. 3 is a general block diagram of a processor for performing this invention.

FIG. 3 is a general block diagram of a processor for practicing this invention. This processor comprises an input unit 21, a central processing unit 22, an output unit 23, and a memory unit 24. For practicing this invention, a plurality of such a processor are used, which are interconnected by communication lines.

The input unit 21 is operated by an operator, and to the input unit 21, information as to a whole circuit which is a whole logic circuit in an integrated circuit, or the like is inputted. The output unit 23 outputs the test patterns generated by the central processing unit 22.

The central processing unit 22 performs the test pattern generation method according to the procedure stored in memory unit 24.

In this embodiment, after the circuit dividing process (step S3), the ATG process is performed by using a plurality of processors. It is thus easy to perform the ATG process by distributed-processing.

Figure 4:
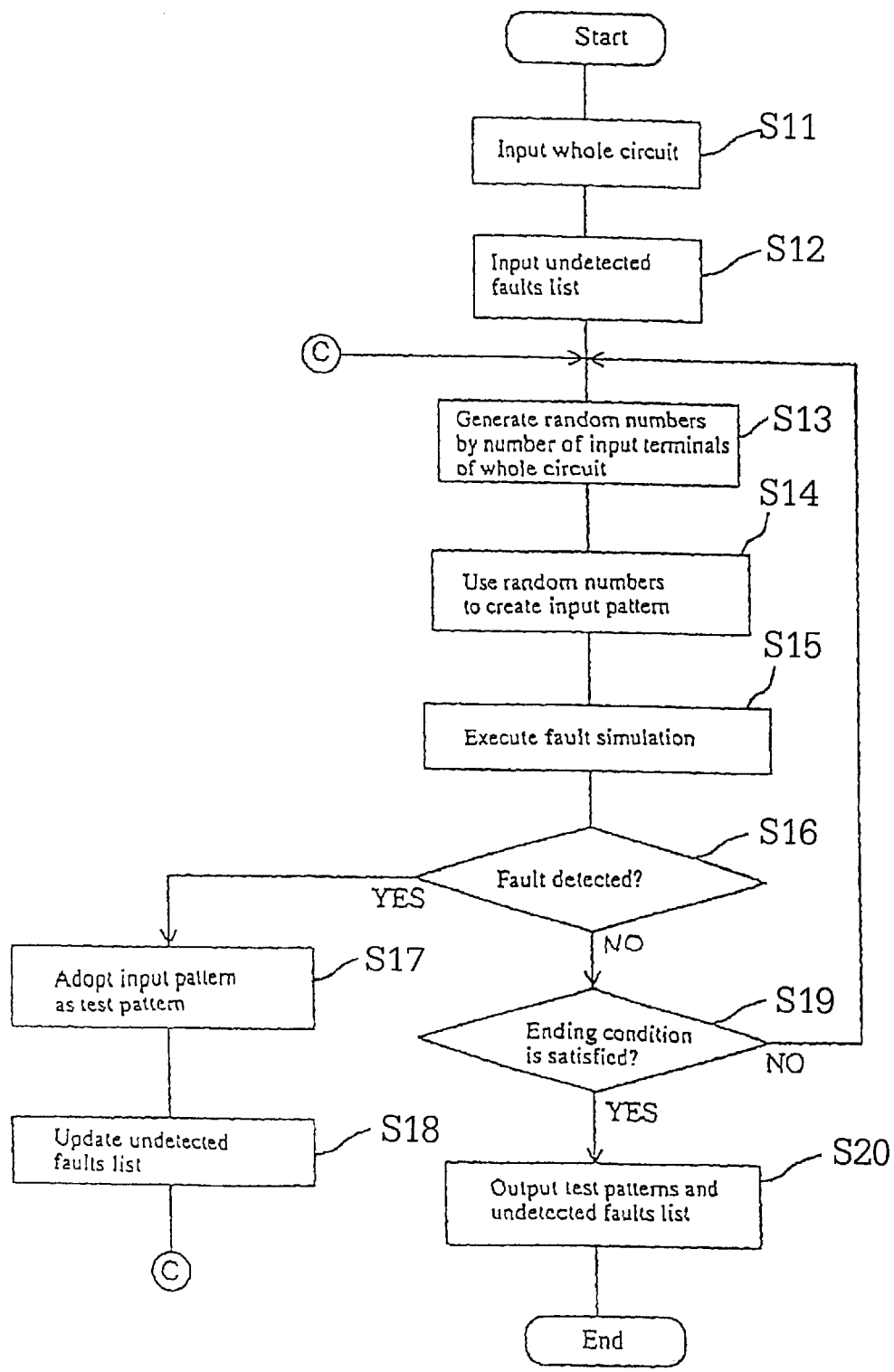
FIG. 4 is a detailed flowchart showing the RTG process in FIG. 2.

Details of the RTG process (step Si) of the first embodiment are now described with reference to FIG. 4. When the central processing unit 22 starts the RTG process, it inputs data as to the whole circuit of the logic circuit (step S11), and inputs an undetected faults list (step S12). When step S12 terminates, the central processing unit 22 generates random numbers based on the number of input terminals of the whole circuit inputted in step S11 (step S13), and creates an input pattern according to the generated random numbers (step S14). Thereafter, the central processing unit 22 uses the input pattern created in step S14 to execute a fault simulation for detecting faults of the whole circuit (step S15).

After this, the central processing unit 22 examines whether or not a fault was detected in step S15 (step S16). If a fault is detected in the whole circuit in step S16, the central processing unit 22 adopts the input pattern created in step S14 as a test pattern (step S17), deletes the detected fault from the undetected faults list of step S12 to update the undetected faults list for the whole circuit (step S18), and returns the process to step S13.

The central processing unit 22 performs steps S13 to S18 until fault detection is saturated. If the fault detection is saturated and no fault is detected in step S16, the central processing unit 22 determines whether the ending condition is satisfied (step S19). If the ending condition is not satisfied in step S19, the central processing unit 22 returns the process to step S13. If the ending condition is satisfied, the central processing unit 22 outputs the finally obtained test patterns and undetected faults list for the whole circuit (step S20), and terminates the RTG process of step S1.

Figure 5:
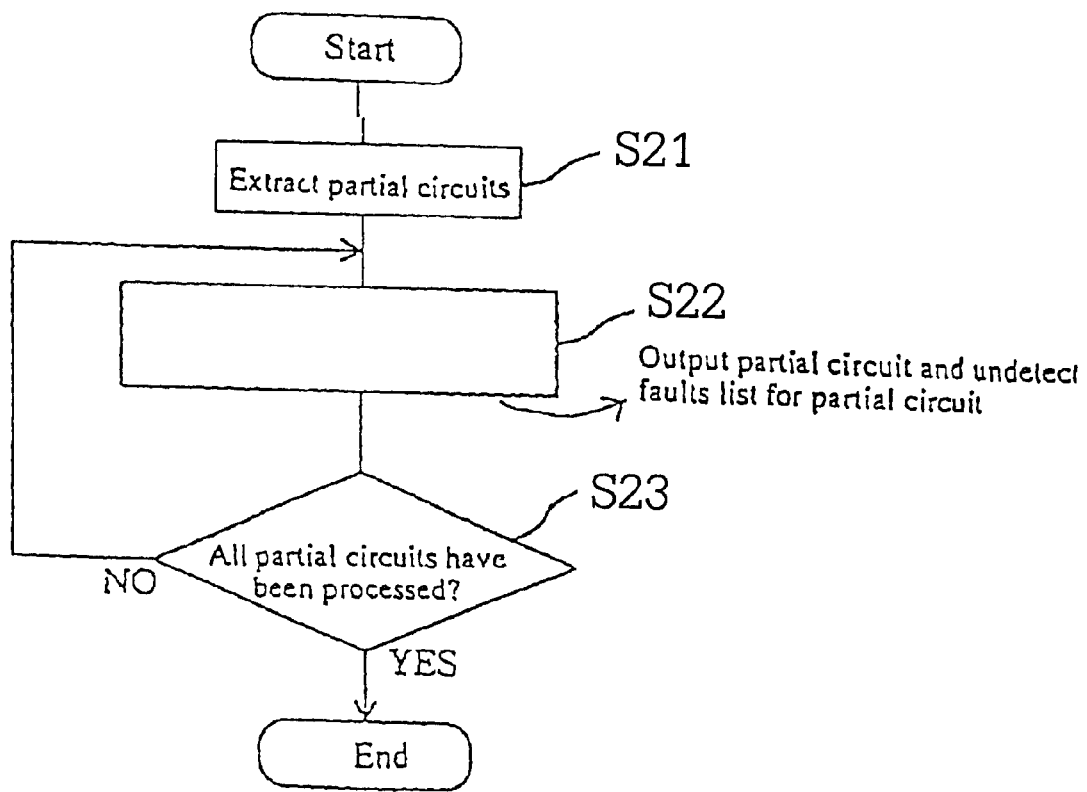
FIG. 5 is a flowchart showing the circuit dividing process in FIG. 2.
Figure 6:
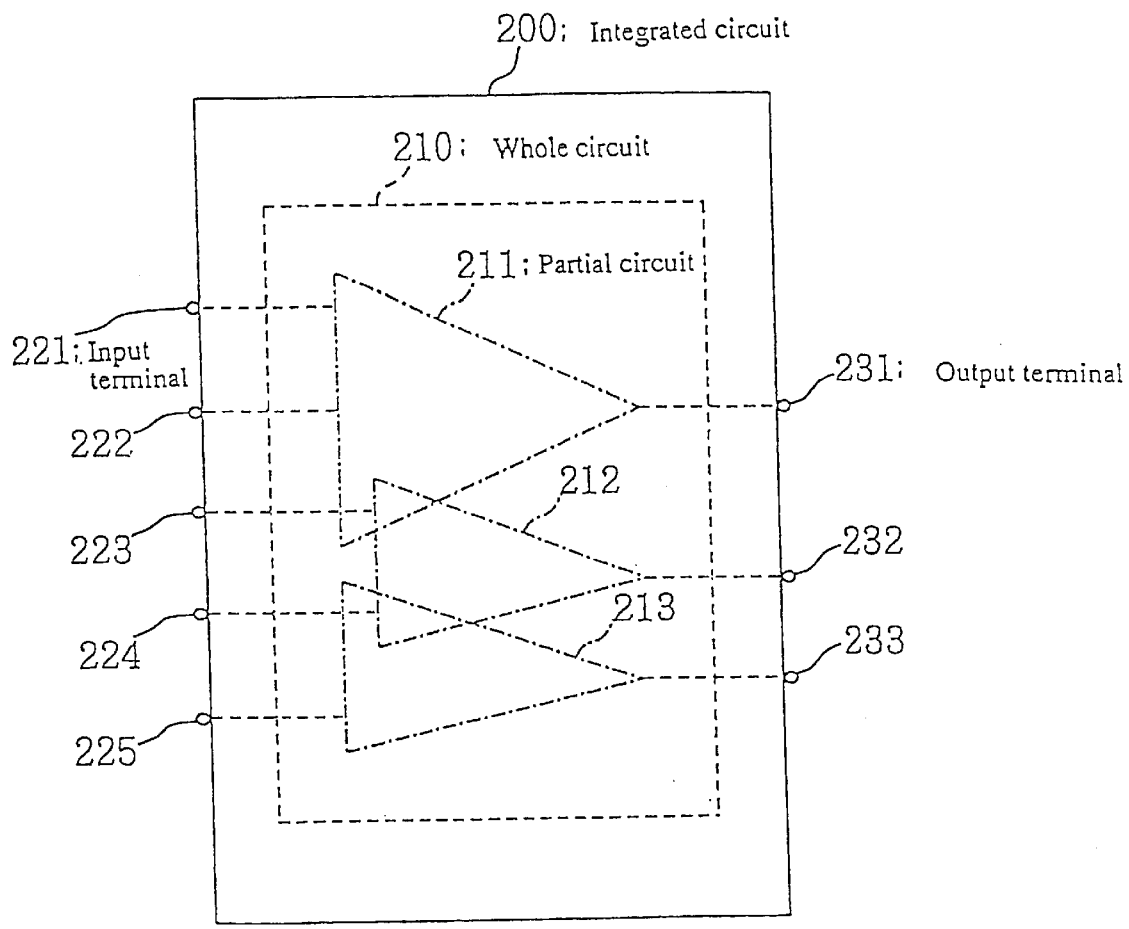
FIG. 6 is a schematic image diagram of an integrated circuit for explaining the circuit division technique of this invention.

Details of the circuit dividing process (step S3) of the first embodiment are now described below with reference to FIGS. 5–7. A specific example of the division process is shown in FIG. 5. The whole circuit, i.e., the target of the division, is a logic circuit in an integrated circuit. As an example of the above circuit, there is a whole circuit 210 in an integrated circuit 200, as shown in FIG. 6. When the whole circuit 210 receives data from the input terminals 221 to 225 of the integrated circuit 200, it sends data which is the result of a logical operation to output terminals 231 to 233.

At first, the central processing unit 22 extracts partial circuits from the whole circuit 210 (step S21). That is, the central processing unit 22 examines the input terminals 221 to 223 having an effect on the value of the output terminal 231 in FIG. 6, and extracts from the whole circuit 210 a partial circuit 211 extending from the output terminal 231 to the input terminals 221 to 223. Similarly, the central processing unit 22 checks the input terminals 223 and 224 having an effect on the output terminal 232 to extract a partial circuit 212, and checks the input terminals 224 and 225 having an effect on the output terminal 233 to extract a partial circuit 213. In this way, the central processing unit 2 extracts the partial circuits 211, 212, and 213 from the whole circuit 210.

When step S21 terminates, the partial circuit 211 extracted in step S21, and a list of faults contained in the partial circuit 211, or the undetected faults list of the partial circuit 211, are outputted (step S22). The outputted partial circuit 211 and undetected faults list of the partial circuit 211 are stored in the memory unit 24. The undetected faults list of the partial circuit 211 includes those of the faults set for the whole circuit 210 which are contained in the partial circuit 211. The above undetected faults list is, for instance, a list of faulty circuit portions such as No. 1 gate of whole circuit 210 . . . at all times outputs "1," and No. 2 gate of whole circuit 210 . . . at all times outputs "0."

The No. 1 gate and No. 2 gate are omitted from the drawings.

When step S22 terminates, the central processing unit 22 determines whether or not the process of step S22 has terminated for the all partial circuits (step S23). As a result of this determination, if there is any partial circuit which has not been processed yet, the central processing unit 22 returns the process to step S22. By this, the partial circuits 212 and 213 and the undetected faults list of the partial circuits 212 and 213 are outputted. On the other hand, if the process has terminated for all the partial circuits (step S23), the central processing unit 22 ends the division process of step S3.

Further details of the division process, or the method for creating partial circuits, is now described below with reference to FIGS. 6 and 7.

Figure 7:
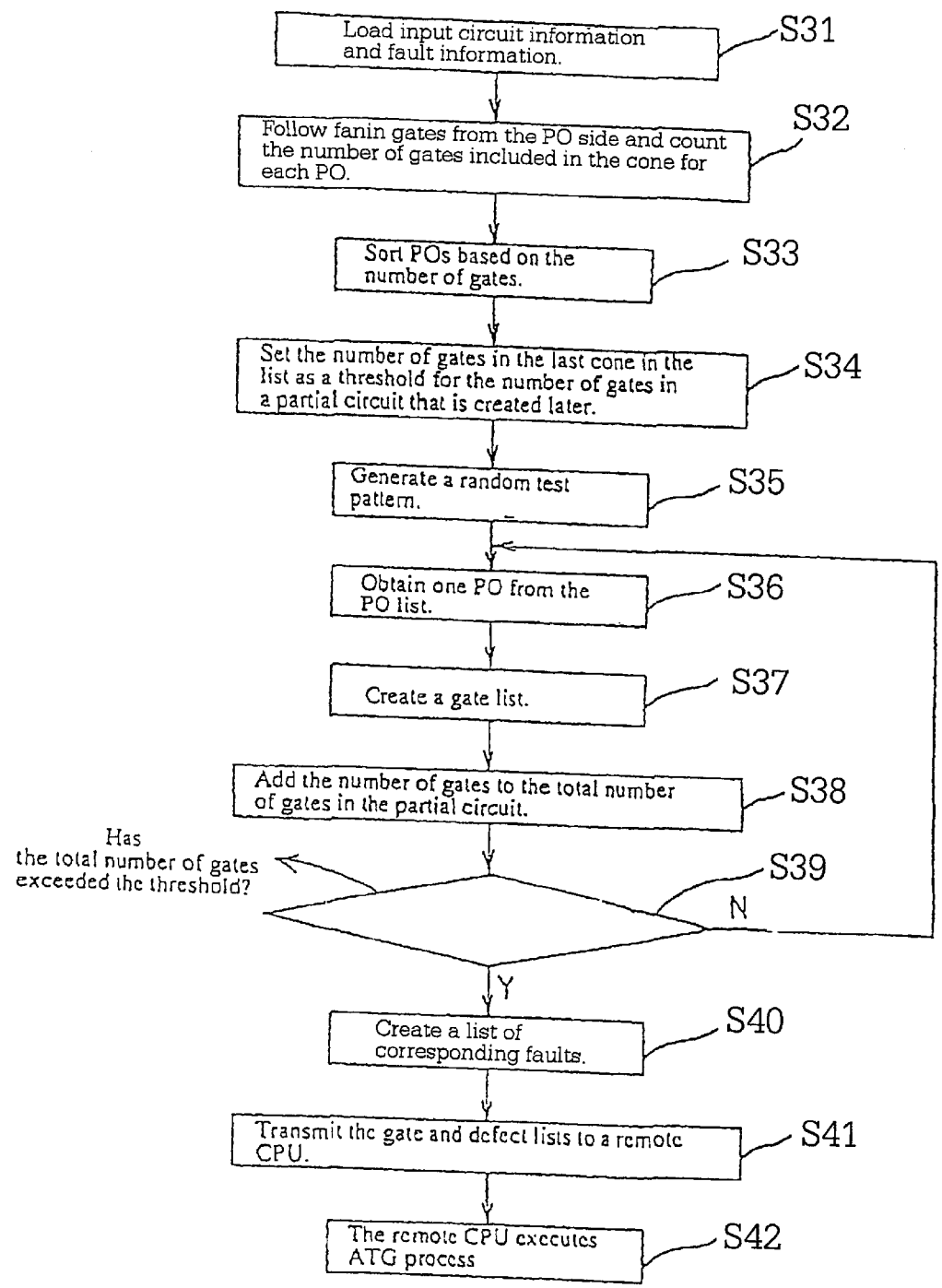
FIG. 7 is a detailed flowchart showing the circuit dividing process in FIG. 2.

FIG. 7 is a flowchart describing one of the methods for creating partial circuits of this invention.

First, information on a whole circuit 210 and fault information thereon are loaded (step S31).

Then, the gates are sequentially followed from the PO (Primary Output) side (231–233) to the input side (221–225), and the number of gates included in each cone (211–213) for each PO (231–233) is counted (step S32). The cone, as used herein, refers to a collection of gates obtained when the gates are sequentially followed from the PO side to the PI (Primary Input) side (221–225).

Then, based on the number of gates included in each cone for each PO, the POs are sequentially sorted starting with the one with the smallest number of gates to create a PO list (step S33) Next, the number of gates included in the cone for the last PO to sort, that is the cone having the largest number of gates, is set as a threshold for the number of gates in each partial circuit that is created later (step S34).

Subsequently, a random test pattern is generated (step S35)

Then, the POs are removed from the PO list one at a time in the sorting order (step S36), and a list of the gates included in the cone for the PO is created (step S37).

Then, based on the list created in step S37, the number of gates included in the cone for the PO obtained in step S36 is added to the total number of gates in a partial circuit (step S38).

Next, it is determined whether the total number of gates in step S38 exceeds the threshold set in step S34 (step S39). If so, a defect list for the partial circuit is created (step S40), and otherwise the process returns to step S36.

The list of the gates created in step S37 and the fault list created in step S40 are transmitted to a remote CPU, or another processor (step S41).

Subsequently, the remote CPU executes the ATG process based on the list of the gates and the defect list transmitted in step S41 (step S42).

As a result, the number of gates in each partial circuit is about equal. This equalizes the load on the processors performing the ATG process.

Figure 8:
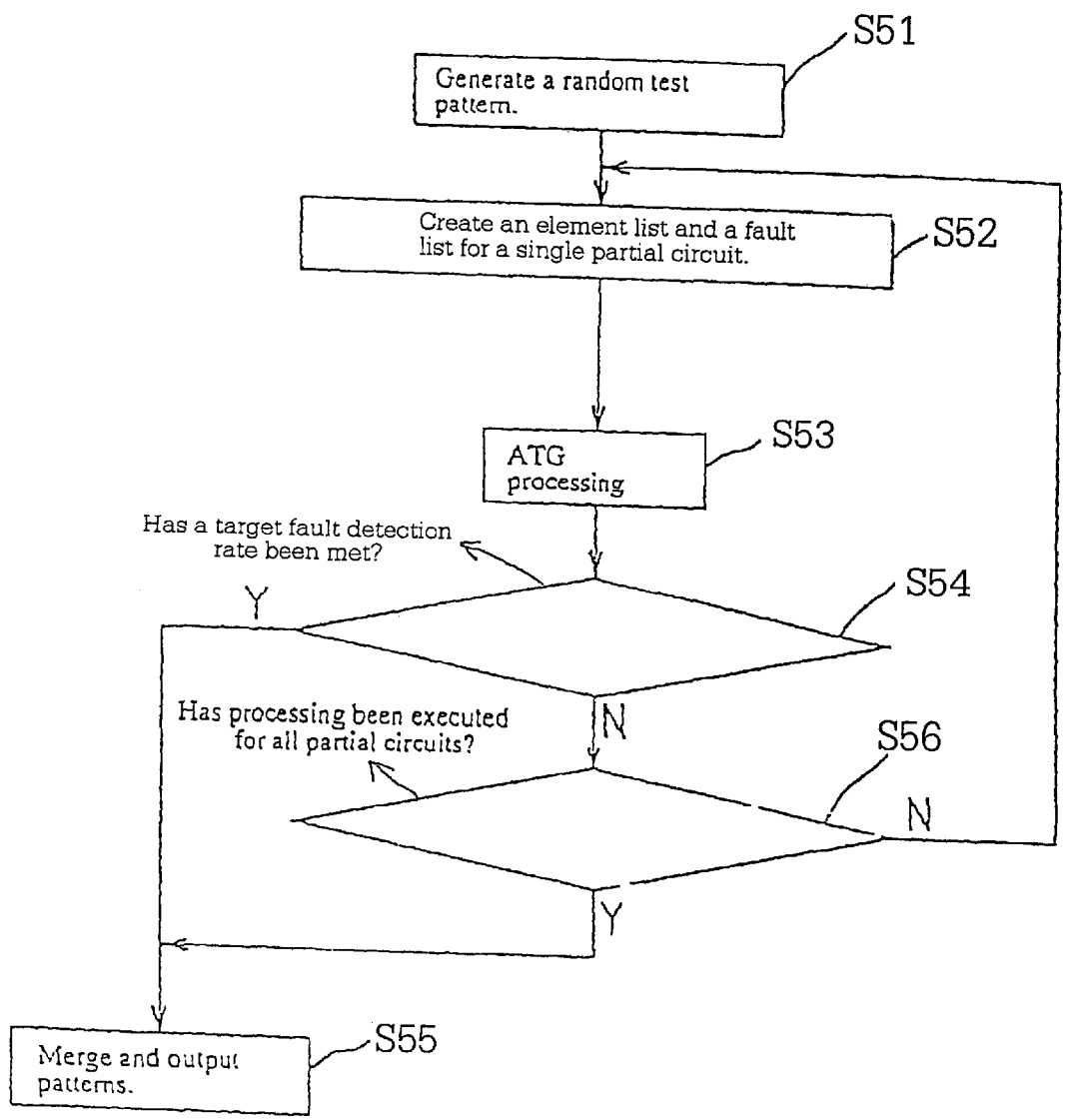
FIG. 8 is a flowchart showing the ATG process in FIG. 2.

Details of the ATG process (step S4) of the first embodiment are now described with reference to FIGS. 1 and 8. After generation of a random test pattern (step S51) and creation of an element list and a fault list for a single circuit (step S52) the partial-circuit and defect information 6 output from the partial-circuit creating means 5 in step S52 are passed to the ATG means 10 in an idle one of the CPUs in the system. Based on the partial-circuit and fault information 6, the ATG means 10 automatically generates a test pattern used to detect faults in the circuit (step S53).

The test pattern generated in step S53 is output as the pattern 12, and the faults that have not been used to generate the test pattern in step S53, that is, undetected faults, are output as the undetected fault information 4 so as to be subsequently used to generate a test pattern.

Subsequently, it is determined whether the faults detected in the above series of processing steps have a value meeting a preset target fault detection rate (step S54). If so, the pattern merging means 13 merges the test patterns 12 generated by the random test pattern generating means 3 and ATG means 10 to output them as an output pattern 14, and the ATG means 10 outputs as the output undetected fault information 15 information on the faults that have not been used to generate the test patterns (step S55).

On the other hand, if it is determined in step S54 that the target fault detection rate has not been met, it is determined whether the processing has been finished for all partial circuits (step S56). If so, the process returns to step S55, and otherwise, the process returns to step S52.

Figure 9:
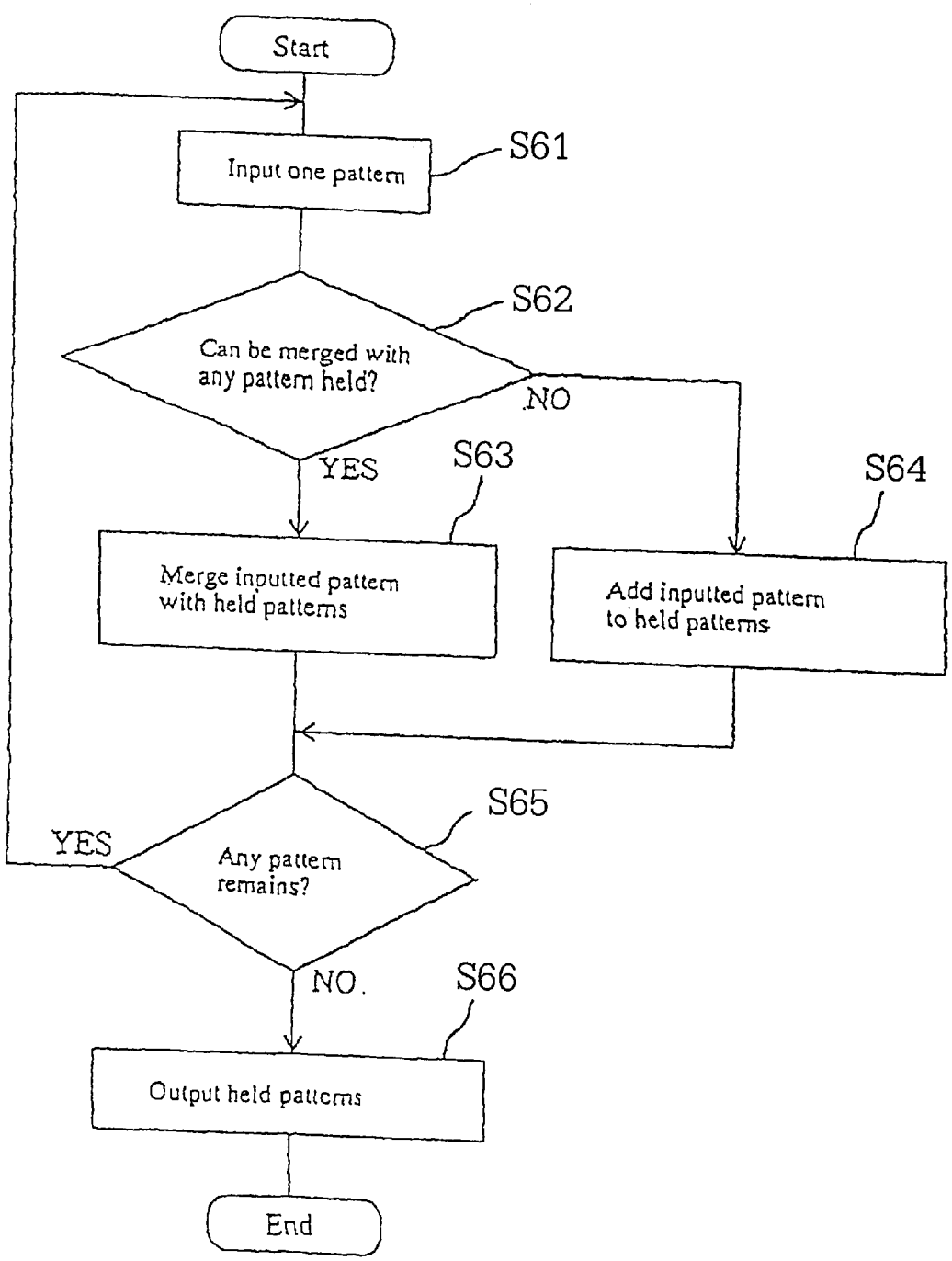
FIG. 9 is a detailed flowchart showing the pattern merge process in FIG. 2.

Details of pattern merge & compression process (step S7) of the first embodiment are now described with reference to FIG. 9. The test pattern merge & compression process is a method for compressing to one of the test patterns generated by the RTG process and ATG process, respectively. The central processing unit 22 then inputs only one test pattern to be processed (step S61). After step S61, the processing unit 22 determines whether it is possible to merge any test pattern currently held and the above test pattern of step S61 (step S62). If the central processing unit 2 determines in step S62 that the merging is possible, it merges the above test patterns of step S61 into one test pattern. Further, if the merging is determined to be impossible in step S62, it decides that the above test patterns of step S61 are to be held, and adds them to the currently held test patterns (step S64).

After step S63 or step S64, the central processing unit 22 determines whether there is any remaining test pattern (step S65). In step S65, if there is a remaining test pattern, it returns the process to step S61. If there is no remaining test pattern in step S65, the central processing unit 22 outputs the test patterns which it finally holds, in steps S63 and S64 (step S66), and terminates the merge & compression process of step S7.

As described above, in accordance with this embodiment, the whole circuit 210 is divided into the partial circuits 211 to 213 and the ATG process is performed, and thus it is made possible to perform the ATG process using a plurality of processors. This enables the shortening of the time for generating test patterns.

Figure 10:
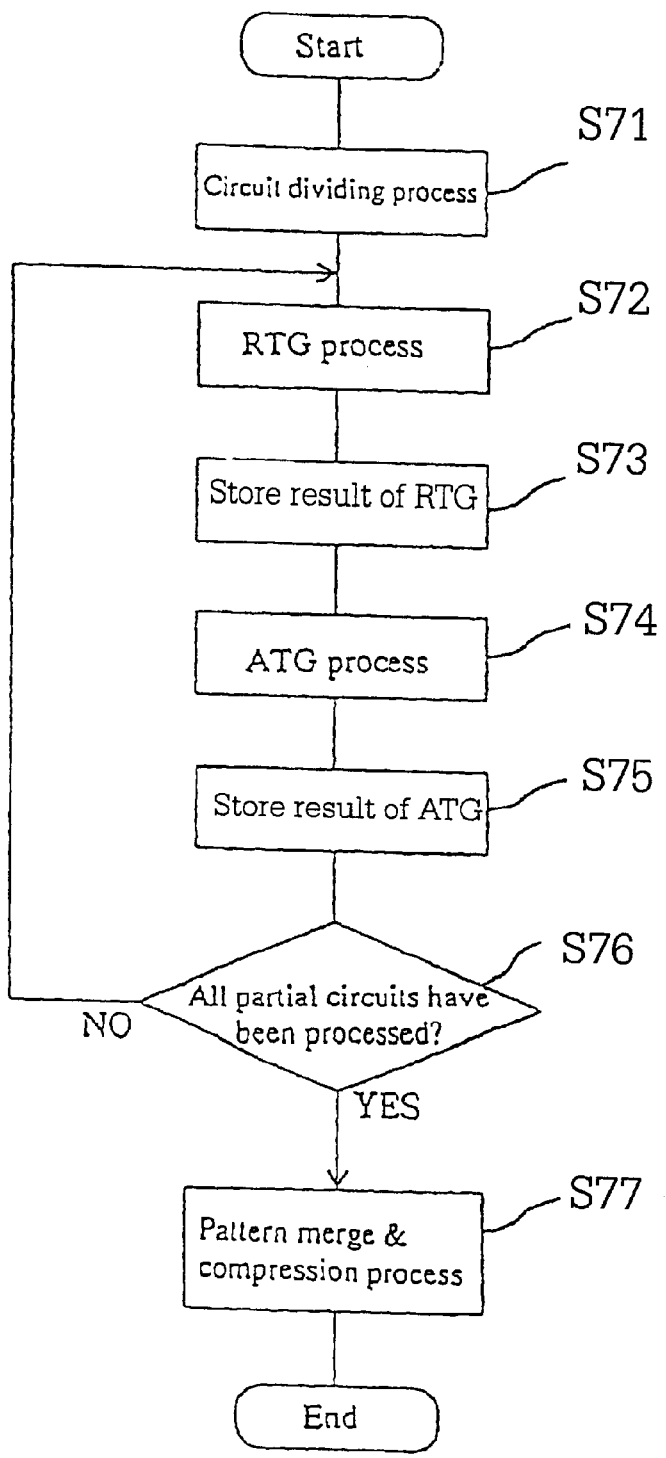
FIG. 10 is a general flowchart showing a second embodiment of a method of test pattern generation according to this invention.
Figure 11:
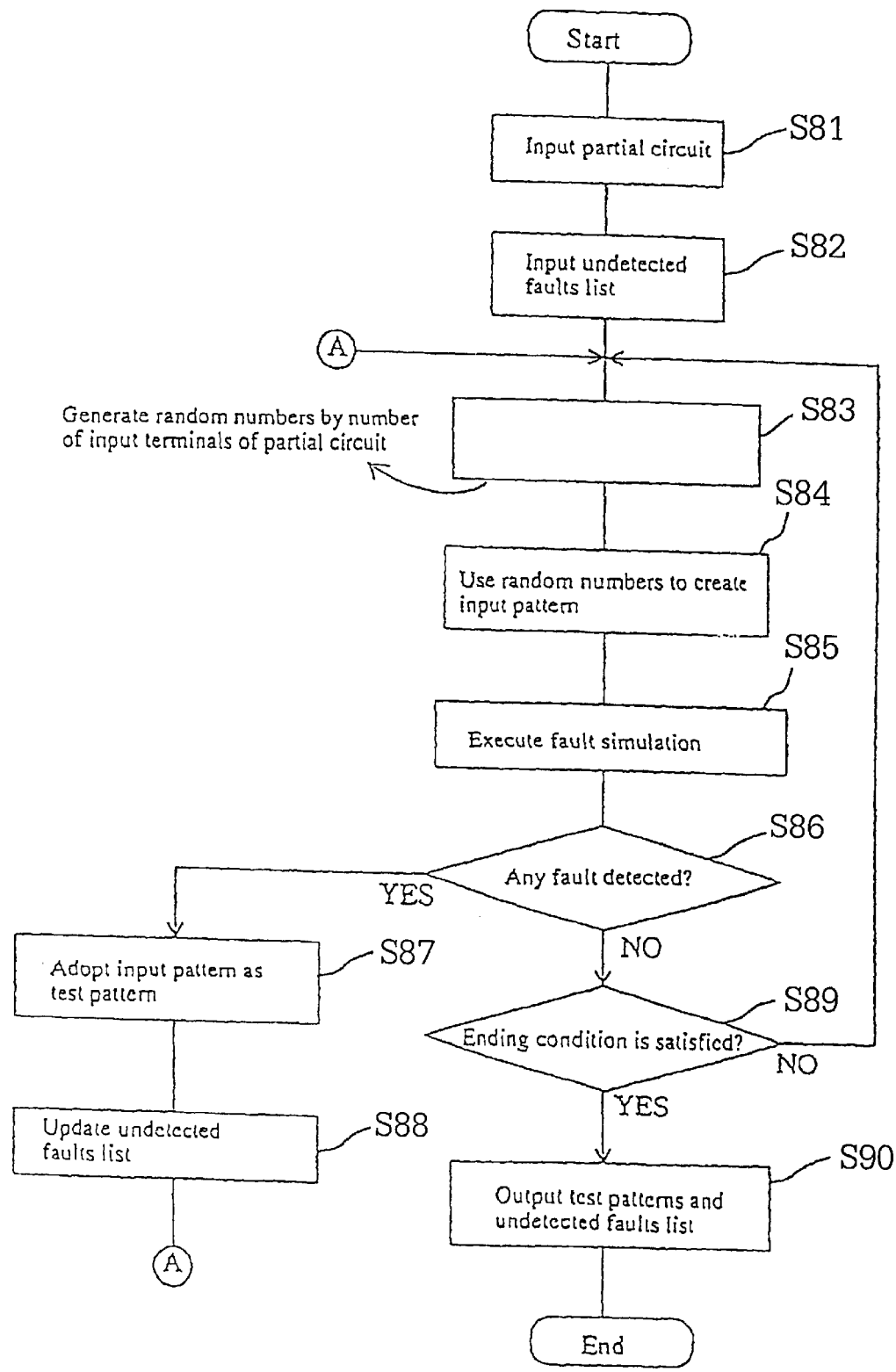
FIG. 11 is detailed flowchart showing the RTG process in FIG. 10.

A second embodiment of the present invention is now described below with reference to FIGS. 10 and 11. FIG. 10 is a general flowchart showing the method of second embodiment. In the first embodiment, the circuit division process is performed after the RTG process. On the other hand, the second embodiment is different from the first embodiment, as the circuit division process is performed before the RTG process. In this embodiment, after the circuit dividing process (step S1), an RTG process (step S72) and ATG process (step S74) regarding each partial circuit are performed simultaneously by a plurality of processors. The details of the second embodiment are essentially the same as the first embodiment except RTG process (step S72).

Details of the RTG process (step S72) of the second embodiment are now described below with reference to FIGS. 3, 6 and 11. The central processing unit 22 reads out the partial circuit 211 outputted in step S71 in FIG. 10 from the memory unit 24, and inputs it (step S81). Similarly, the central processing unit 22 inputs the undetected faults list of the partial circuit 211 (step S82).

When step S82 terminates, the central processing unit 22 generates the random numbers of the input terminals 221 to 223 of the partial circuit 211 that was inputted in step S81 (step S83), and creates an input pattern by the generated random numbers (step S84). Thereafter, the central processing unit 22 uses the input pattern created in step S84 to execute a fault simulation for detecting the faults of the partial circuit 211 (step S85).

When step S85 terminates, the central processing unit 22 checks whether any fault has been detected in the fault simulation (step S86). If a fault is detected in the partial circuit 211 in step S86, the central processing unit 22 adopts the input pattern created in step S84 as the test pattern for the partial circuit 211 (step S87), deletes the detected fault from the undetected faults list to update the undetected faults list of the partial circuit 211 (step S88), and returns the process to step S83.

The central processing unit 22 performs steps S83 to S88 until the fault detection for the partial circuit 211 saturates. If the fault detection saturates and there is no fault detection in step S86, the central processing unit 22 determines whether the ending condition is satisfied in step S89. As a result of the determination, if the ending condition is not satisfied, the central processing unit 22 returns the process to step S83. Further, if the ending condition is satisfied, the central processing unit 22 outputs the finally obtained test patterns and undetected faults list for the partial circuit 211 (step S90), and terminates the RTG process of step S72.

In accordance with this embodiment, the RTG process and the ATG process are performed after dividing the whole circuit 210 into the partial circuits 211 to 213, and thus the RTG process and the ATG process can be performed using a plurality of processors. This enables the shortening of the time for generating test patterns.

Further, when the RTG process and the ATG process are concurrently performed using a plurality of processors, the respective processors deal with the partial circuits 211 to 213, so the burden on the memory unit of each processors and the like can be lightened.

Now, a third embodiment of this invention is described.

Figure 12:
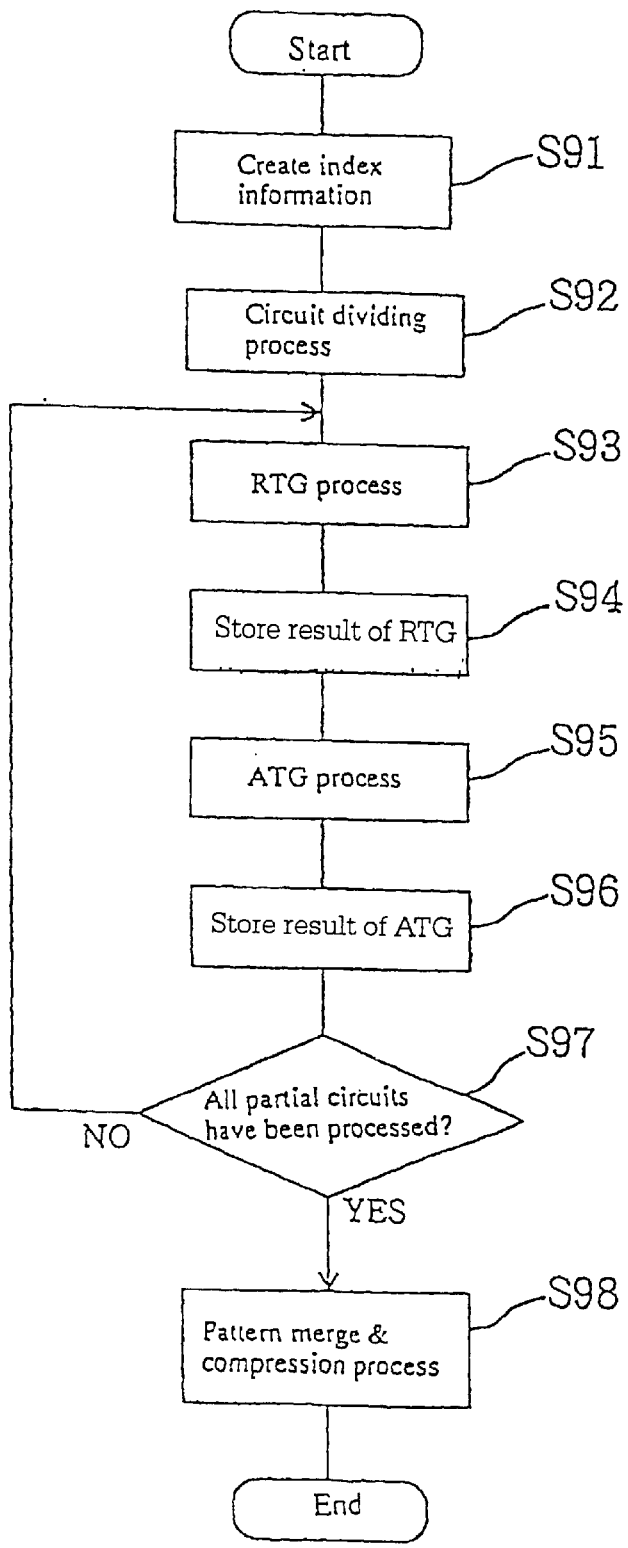
FIG. 12 is a general flowchart showing a third embodiment of a method of test pattern generation according to this invention.
Figure 13:
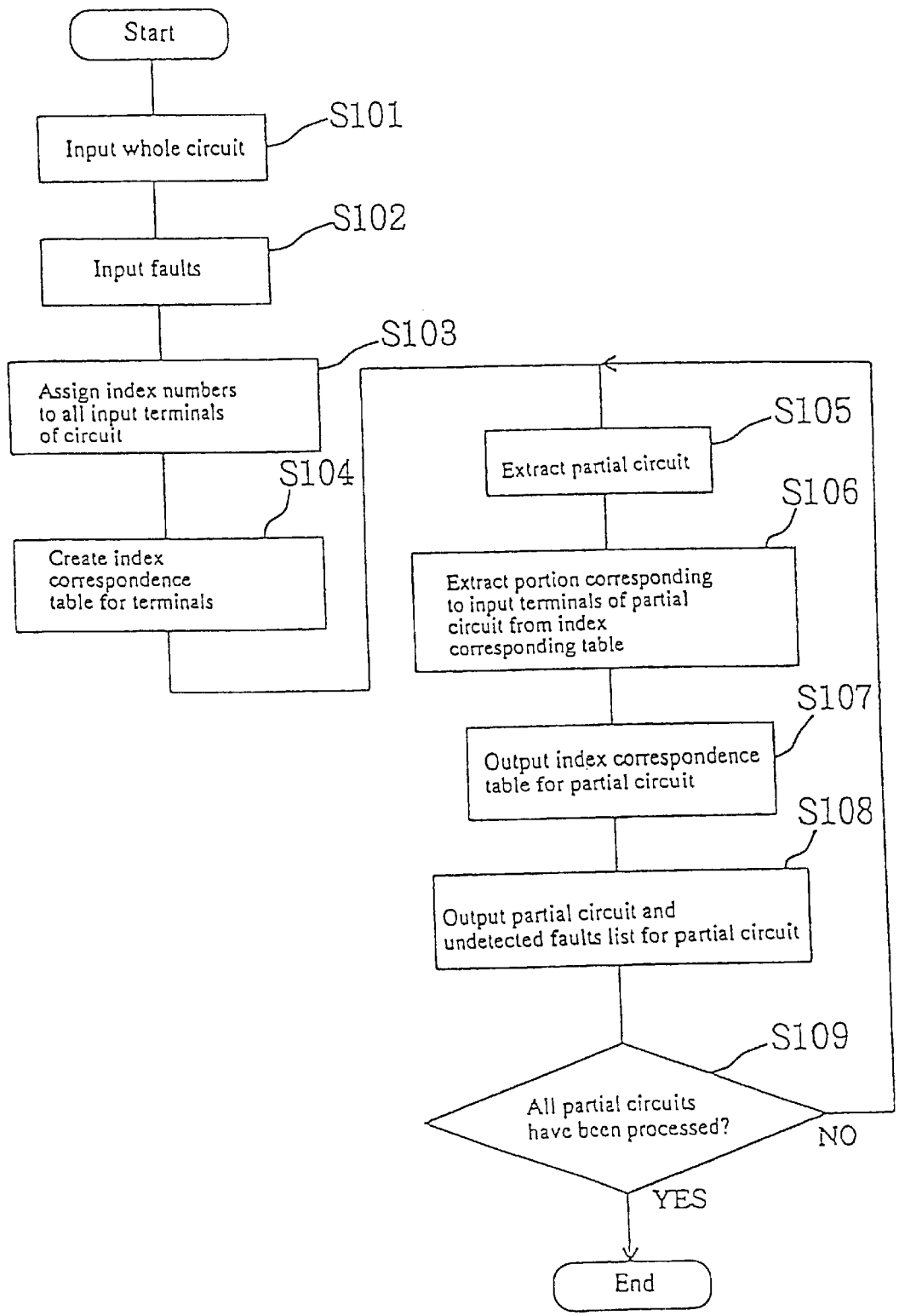
FIG. 13 is a flowchart showing the circuit dividing process used in FIG. 12.
Figure 14:
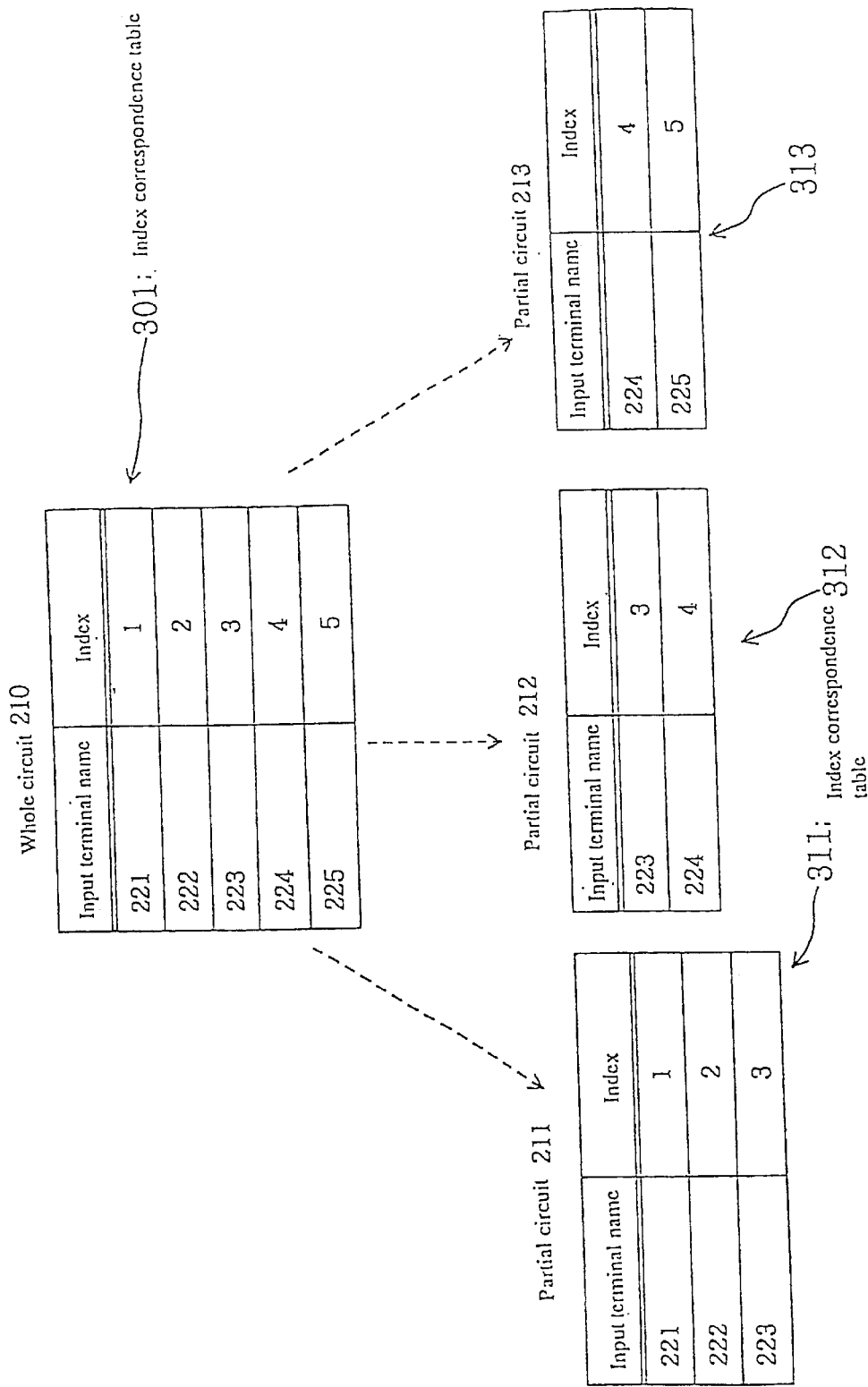
FIG. 14 is a diagram for explaining the index information used in the third embodiment.
Figure 15:
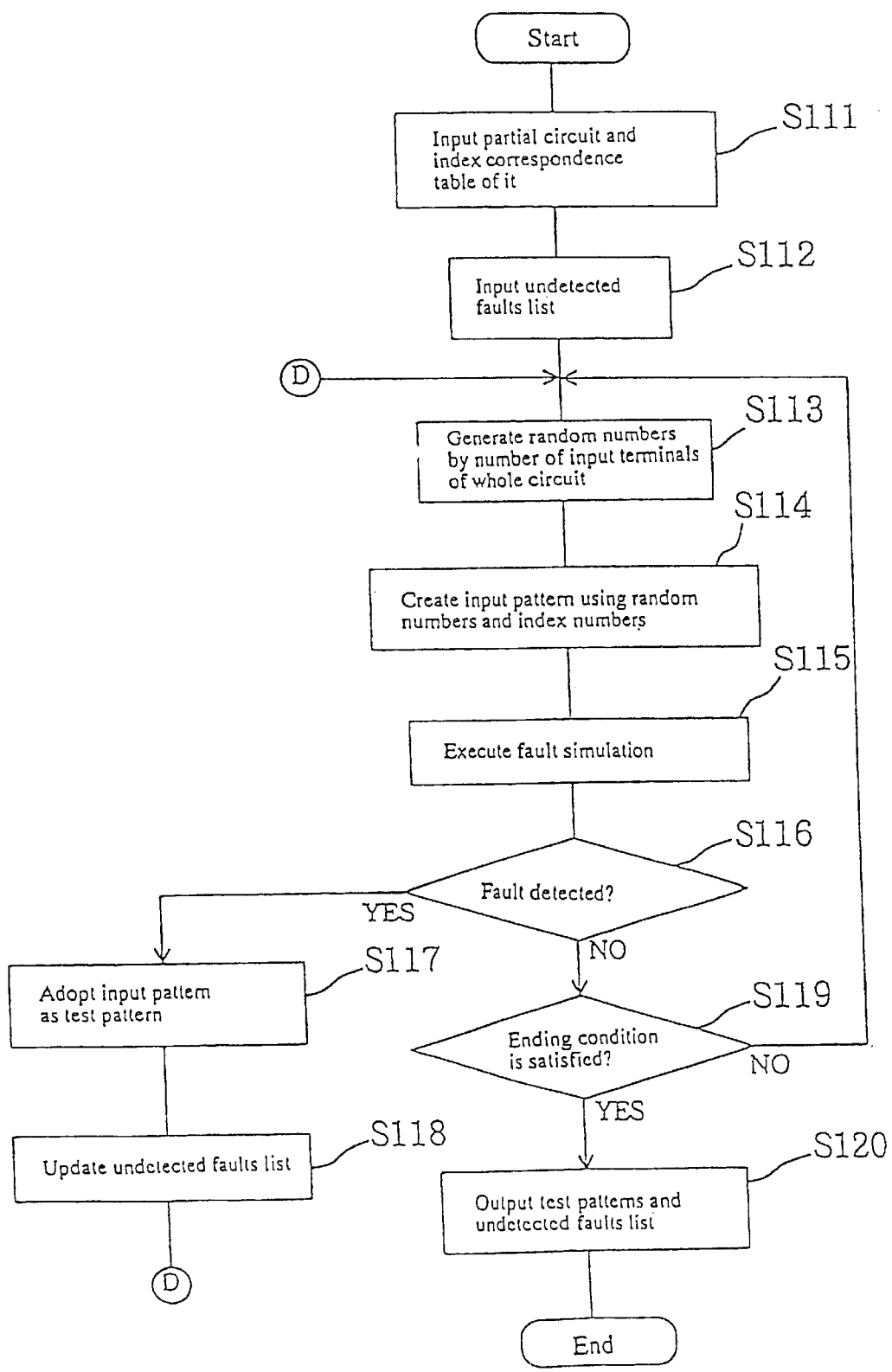
FIG. 15 is a flowchart showing the RTG process in FIG. 12.
Figure 16:
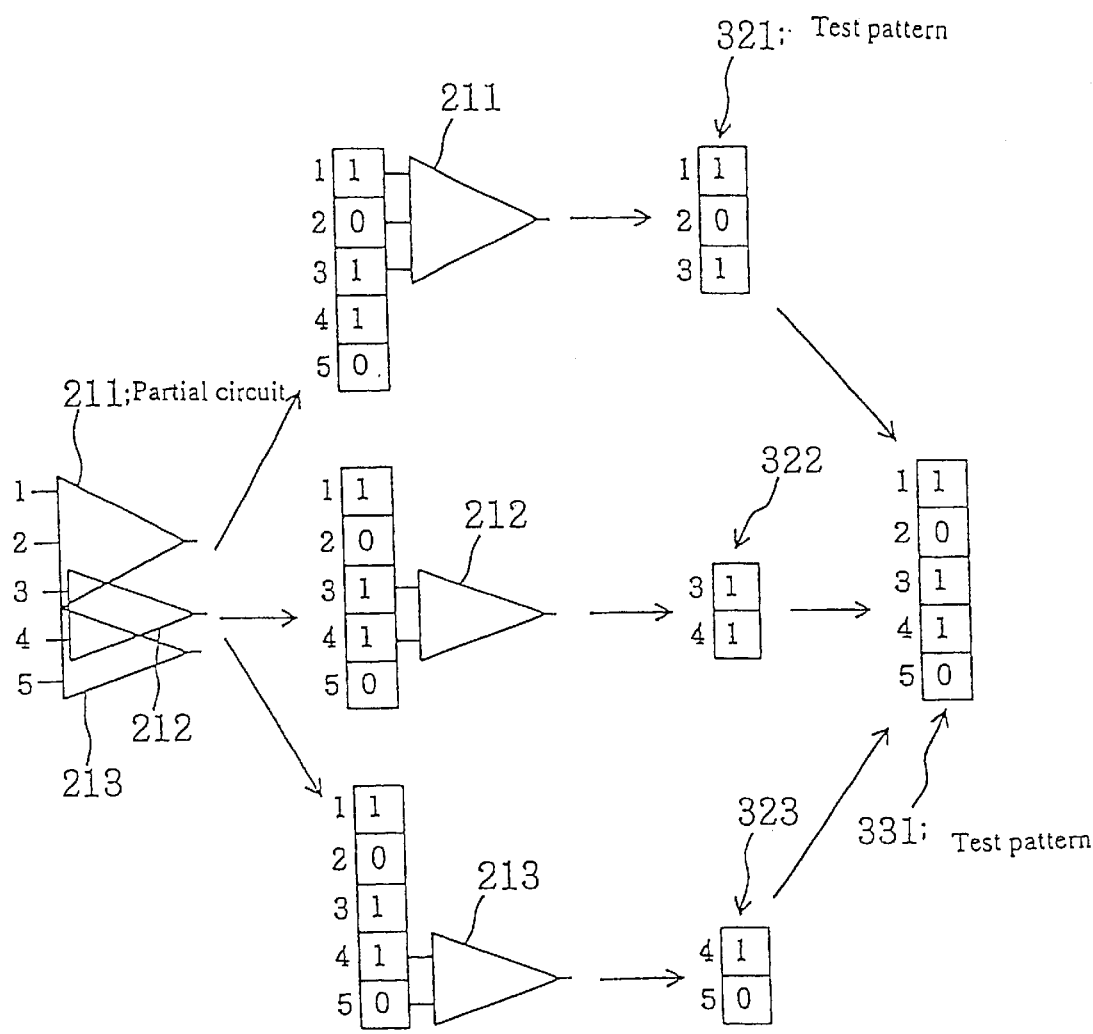
FIG. 16 is a supplementary diagram showing the test pattern generation of the third embodiment.

FIG. 12 is a flowchart showing the test pattern generation method for the third embodiment of this invention, whereas FIG. 13 is a flowchart showing the division process used by this test pattern generation method, FIG. 14 is a diagram explaining the index information used by this test pattern generation method, FIG. 15 is a flowchart showing the RTG process used by this test pattern generation method, and FIG. 16 is a diagram showing the test pattern generation by this test pattern generation method.

Further, in this embodiment, only the procedure stored in the memory unit 24 of the first embodiment is different, and thus only this point is described. According to the procedure stored in the memory unit 24 of this embodiment, the central processing unit 22 performs the following processes. That is, the central processing unit 22 creates index information used for the whole circuit 210, as shown in FIG. 12 (step S91). The central processing unit 22 creates index numbers "1" to "5" as index information. The index numbers "1" to "5" are index information to identify the input terminals 221 to 225 for finding out the input terminals 221 to 225.

After step S91, the central processing unit 22 performs the circuit division process (step S92). A specific example of the division process is shown in FIG. 13. That is, the central processing unit 22 inputs the whole circuit 210 (step S101) After step S101, the central processing unit 22 sets faults for circuit portions in the whole circuit 210 (step S102).

When step S102 terminates, the central processing unit 22 assigns the index numbers "1" to "5" to the input terminals 221 to 225 of the whole circuit 210 (step S103), and as shown in FIG. 14, creates an index correspondence table 301 of the whole circuit 210 (step S104). The index correspondence table 301 shows the correspondence between the input terminals 221 to 225 and the index numbers "1" to "5", and for instance, it shows that the index number "1" corresponds to the input terminal 221.

When step S104 terminates, the central processing unit 22 extracts the partial circuit 211 from the whole circuit 210 (step S105). After step S105, the central processing unit 22 extracts the index correspondence table 311 of the partial circuit 211 from the index correspondence table 301 of the whole circuit 210, as shown in FIG. 14 (step S106). The central processing unit 22 outputs the index correspondence table 311 extracted in step S106 (step S107) When step S107 terminates, the central processing unit 22 outputs the partial circuit 211 and the undetected faults list for the partial circuit 211 (step S108).

When step S108 terminates, the central processing unit 22 determines whether the processes of steps S105 to S108 have terminated for all the partial circuits (step S109). If there is any partial circuit which has not been processed yet, in step S109, then the central processing unit 22 returns the process to step S105. By this, the index correspondence tables 312 and 313 of the partial circuits 212 and 213 and the undetected faults lists for the partial circuits 212 and 213 are outputted. Further, in step S109, if the processes for all the partial circuits terminate, the central processing unit 22 terminates the division process of step S92.

When the central processing unit 22 terminates step S92, it then performs an RTG process (step S93). A specific example of the RTG process is shown in FIG. 15. That is, the central processing unit 22 receives the partial circuit 211 and the index correspondence table 311 which have been outputted in step S92 of FIG. 12 (step S111), and also receives the undetected faults list for the partial circuit 211 (step S112).

When step S112 terminates, the central processing unit 22 generates random numbers for the input terminals 221 to 225 of the whole circuit 210 (step S113). The central processing unit 22 then uses the random numbers generated in step S113 and the index correspondence table 301 to make the generated random numbers correspond to the index numbers "1" to "5." Thereafter, the central processing unit 22 uses the index numbers "1" to "3" of the index correspondence table 311 to create an input pattern 321 for the partial circuit 211 (step S114), as shown in FIG. 16. In this case, since, in step S113, random numbers "10110" correspond to the index numbers "1" to "5," a pattern formed by the random numbers "101" corresponding to the terminals 221 to 223 or the index numbers "1" to "3" is adopted as the input pattern 321 for the partial circuit 211.

When step S114 terminates, the central processing unit 22 uses the input pattern 321 created in step S114 to execute a fault simulation for detecting the faults of the partial circuit 211 (step S115). When step S115 terminates, the central processing unit 22 examines whether a fault has been detected in the above fault simulation (step S116) In step S116, if a fault has been detected in the partial circuit 211, the central processing unit 22 adopts the input pattern created in step S114 as a test pattern for the partial circuit 211 (step S117) deletes the detected fault to update the undetected faults list for the partial circuit 211 (step S118), and returns the process to step S113.

The central processing unit 22 performs steps S113 to S118 until the fault detection for the partial circuit 211 saturates. If there is no fault detected in step S116 upon saturation of the fault detection, the central processing unit 22 determines whether the ending condition is satisfied (step S119). If the ending condition is not satisfied in step S119, the central processing unit 22 returns the process to step S113.

Further, if the ending condition is satisfied in step S119, the central processing unit 22 outputs the finally obtained test patterns and undetected faults list for the partial circuit 211 (step S120), and terminates the RTG process of step S93. The central processing unit 22 holds the output of step S93 when terminating step S93 (step S94).

Thereafter, the central processing unit 22 performs steps S95 to S97, but the process in steps S95 to S97 are the same as steps S4 to S6 in FIG. 2, and thus the description of them is omitted. When the next step is performed after the termination of step S97, the central processing unit 22 obtains the test patterns 321 to 323 for the partial circuits 211 to 213 by the RTG process, and the test patterns by the ATG process.

When the process for the partial circuits 211 to 213 terminates in step S97, the central processing unit 22 merges into one the test patterns generated by the RTG process, saved in step S94, and merges and compresses the test patterns by the ATG process, saved in step S96, as much as possible (step S98), and terminates the process.

The central processing unit 22 performs the following processing for merging test patterns with reference to FIG. 14.

For instance, for the partial circuit 211 and the partial circuit 212, the index correspondence tables 311 and 312 show that the input terminal 223 is shared. In this case, if the input terminal 223 belonging to the partial circuit 211 takes a value of "0," and the input terminal 223 belonging to the partial circuit 212 takes a value of "1," then merge is not available.

However, in this embodiment, as shown in FIG. 16, the test patterns 321 to 323 for the partial circuits 211 to 213 are generated based on the index numbers "1" to "5," respectively, and thus, to merge the input terminals 223 of the index number "3" which are shared by the partial circuits 211 and 212, the central processing unit 22 needs only to set the value of the input terminal 3 to "1" according to the above table. Further, to merge the input terminals 224 of the index number 11411 which are shared by the partial circuits 212 and 213, the central processing unit 2 needs only to set the value of the input terminal 3 to "1." In this way, a test pattern 331 can be obtained by merging the test patterns 321 to 323 for the partial circuits 211 to 213 in FIG. 16.

As described above, in accordance with this embodiment, since the RTG process and the ATG process are performed after dividing the whole circuit 210 into the partial circuits 211 to 213, the RTG process and the ATG process can be performed in parallel using a plurality of generating apparatuses. This allows the shortening of the time for generating test patterns by the RTG process and the ATG process.

In addition, in this embodiment, to perform the RTG process, random numbers are generated for the input terminals 221 to 225 which are given the index numbers "1" to "5," and then the test patterns for the partial circuits 211 to 213 are extracted from the pattern for the whole circuit 210 according to the index numbers of the input terminals, thereby to generate test patterns. As a result, the same random number is given to the same input terminal, and thus the random number test patterns of the partial circuits 211 to 213 can always be merged, and the number of test patterns thereby minimized.

As noted above, attempting to detect faults that are difficult to detect requires a large amount of time. For example, 10 or more hours are required to detect faults in an entire circuit that has 1M gates, and several hours may be required to detect one of these faults that is difficult to detect.

Thus, in the above embodiments, if faults that are difficult to detect are locally present in the circuit and if partial circuits having these faults are processed first, an unnecessarily long time is required to detect easily detectable faults if they are present in partial circuits that are processed later.

In addition, even if the target fault detection rate can be reached without detecting faults that are difficult to detect, since processing is executed to detect these faults, an unnecessarily long time is required to reach the target fault detection rate.

This invention also adresses those problems of the divisional pattern generation techniques, and to that end a fourth embodiment of the present invention is described below with reference to FIGS. 17 and 18.

Figure 17:
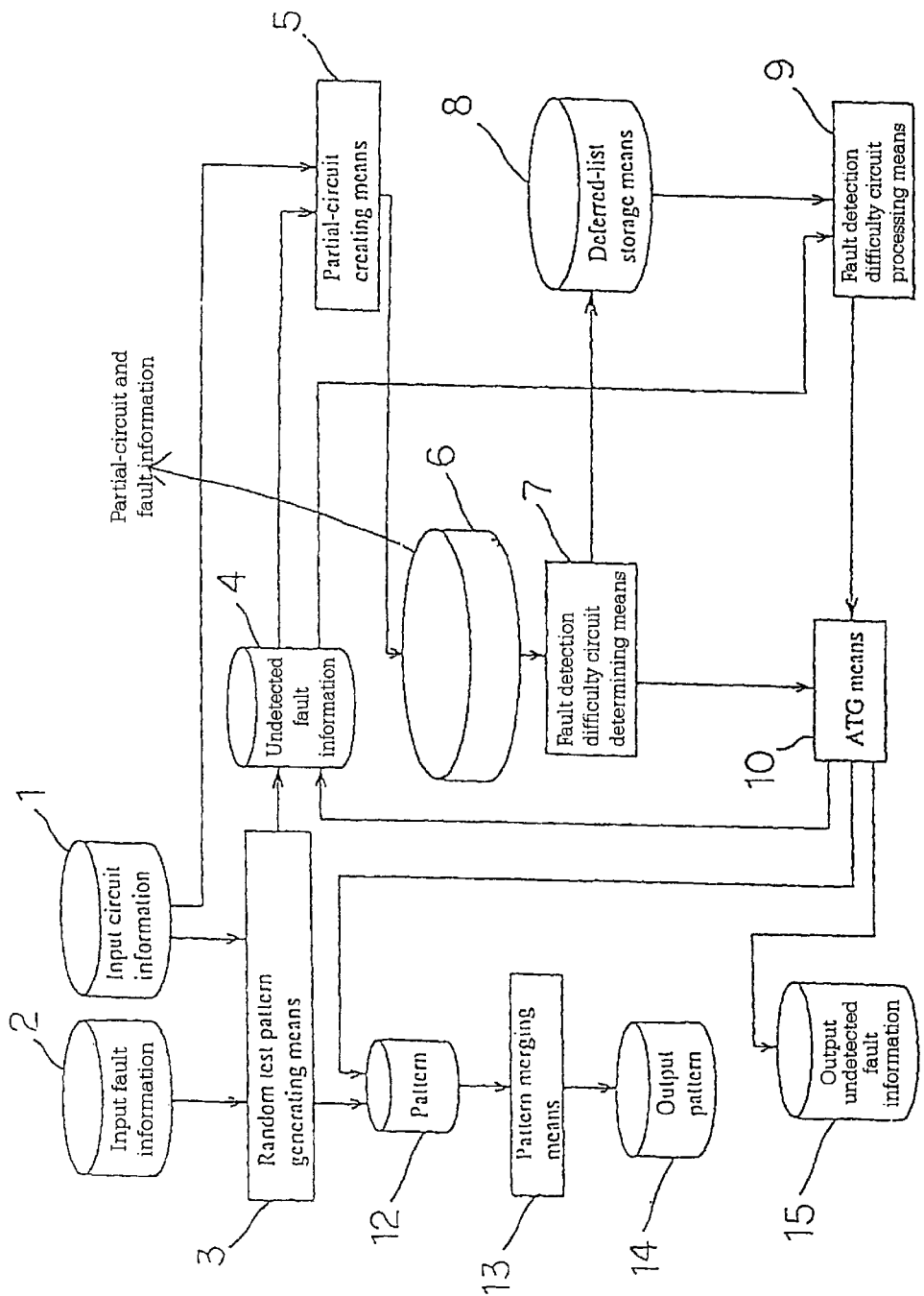
FIG. 17 is a block diagram showing a fourth embodiment of a test pattern generation system according to this invention.

As shown in FIG. 17, the fourth embodiment further comprises a fault detection difficulty circuit determining means 7, a deferred-list storage means 8, and a fault detection difficulty circuit processing means 9 in addition to the elements of the first embodiment structure described in FIG. 1.

A fault detection difficulty determining means 7 operates based on the partial circuit and fault information 6 output from the partial-circuit creating means 5. The fault detection difficulty determining means 7 outputs the fault information for a partial circuit as a deferred list if the number of faults in the partial circuit is larger than a predetermined value or depends on the partial-circuit and fault information 6. The fault detection difficulty determining means 7 directly outputs the fault information for that partial circuit if the number of faults in the partial circuit is smaller than or equal to a predetermined value or does not depend on the partial-circuit and fault information 6.

A deferred-list storage means 8 stores the deferred list outputted from the fault detection difficulty circuit determining means 7.

A defect detection difficulty circuit processing means 9 outputs to the ATG means 10 the deferred list stored in the deferred-list storage means 8. In addition, if the defect detection rate has not reached the specified value after the ATG means 10 automatically generates a test pattern based on the partial-circuit and defect information 6 that has not been output by the defect detection difficulty circuit determining means 7 as the deferred list, then the defect detection difficulty circuit processing means 9 outputs to the ATG means 10 the deferred list stored in the deferred-list storage means 8.

Figure 18:
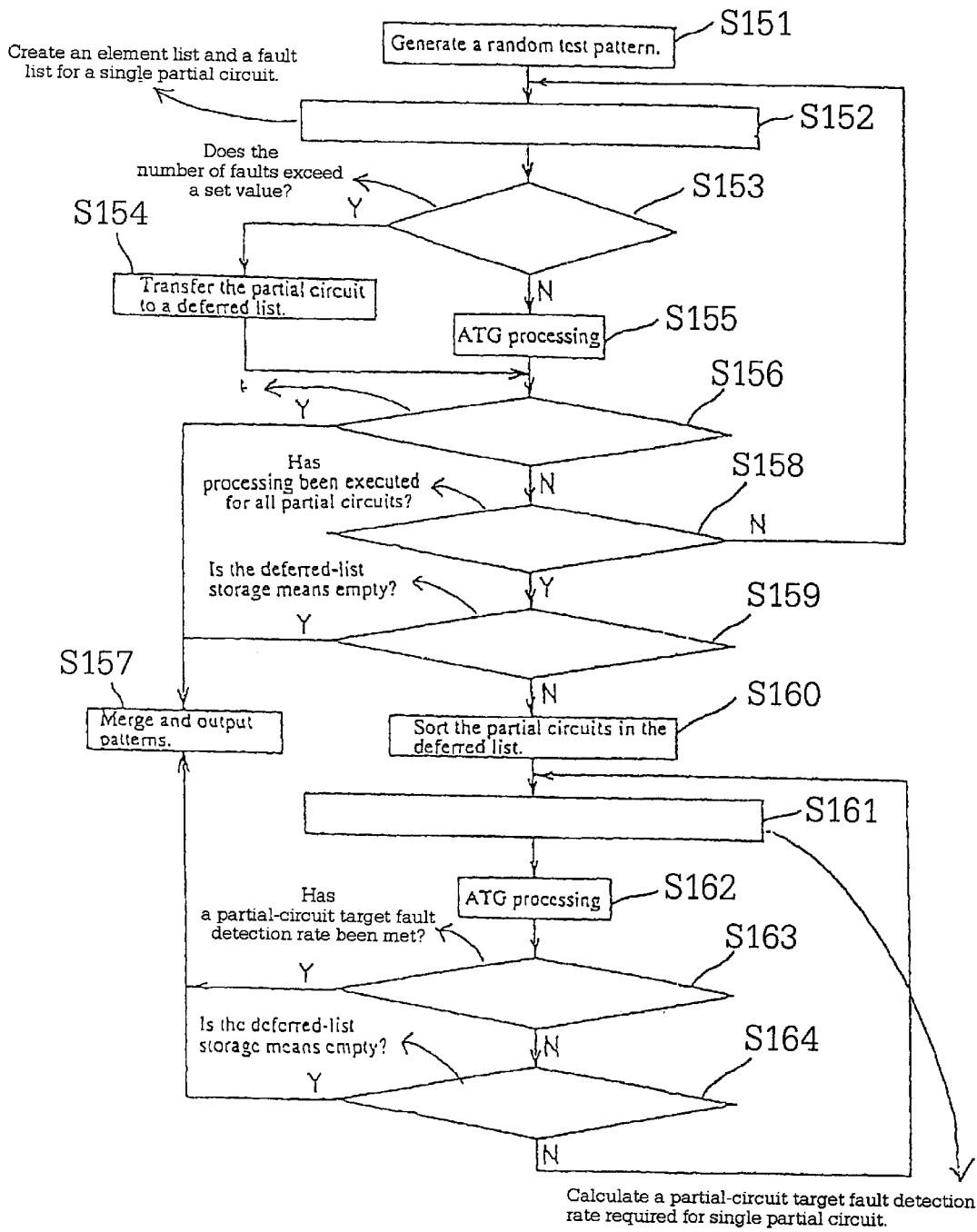
FIG. 18 is a flowchart showing a fourth embodiment of a method of test pattern generation according to this invention.

As shown in FIG. 18, the random test pattern generating means 2 first uses random numbers to generate a random pattern, and executes defect simulation to detect faults using the generated random pattern and information on those of the faults stored as the input defect information 2 that have not been detected. Then, a fault pattern detected by the fault simulation is used as a test pattern (step S151). The detected faults are excluded from the subsequent pattern generation.

The processing in step S151 may be executed for the entire circuit prior to the creation of partial circuits or for the respective partial circuits after their creation. This embodiment executes this processing for the entire circuit prior to the creation of partial circuits. In addition, the random test pattern generating processing tends to detect easily detectable faults, so the number of faults that can be detected by this method can be used as an index indicating whether the circuit is configured to allow defects therein to be detected easily.

The test pattern generated in step S151 is output as the pattern 12, and the faults that have not been detected by the fault simulation in step S151 are output as the undetected fault information 4 so as to be subsequently used to generate a test pattern.

Next, based on the input circuit information 1, the partial-circuit creating means 5 divides the circuit for ATG processing into partial circuits the number of which is larger than that of CPUs to generate the partial circuits, and based on the generated partial circuits and the undetected fault information 4, generates information on faults that can be detected in the partial circuits to output it as the partial-circuit and fault information 6 (step S152).

Next, based on the partial-circuit and defect information 6 output from the partial-circuit creating means 5, the defect detection difficulty circuit determining means 7 determines whether the number of defects in a partial circuit is larger than a predetermined value (step S153).

By determining whether the number of defects in the partial circuit is larger than a predetermined value, it can be determined whether faults in the partial circuit can be detected easily. In general, circuit faults are difficult to detect, when input data is branched to a plurality of gates while these data are combined into one at the output. Fault detection is yet more difficult in a circuit in which each branched data input is further branched. A value used to determine whether it is difficult to detect defects in a circuit may be predetermined, but is normally set based on the ratio of the number of faults detected by the random test pattern generating means 3 to the number of faults defined for the entire circuit.

If it is determined at step S153 that the number of faults in the partial circuit exceeds a predetermined value, the fault detection difficulty determining means 7 outputs the fault information for the partial circuit as a deferred list, which is then stored in the deferred-list storage means 8 (step S154).

On the other hand, if it is determined at step S153 that the number of faults in the partial circuit is smaller than or equal to the predetermined value, the fault information for the partial circuit is passed to the ATG means 10 in one of the idle CPUs used for test pattern generation. Based on the partial-circuit and fault information 6, the ATG means 10 automatically generates a test pattern used to detect defects in the circuit (step S155).

The test pattern generated in step S155 is output as the pattern 12, and the faults that have not been used to generate the test pattern in step S155, that is, undetected faults, are output as the undetected fault information 4 so as to be subsequently used to generate a test pattern.

Subsequently, it is determined whether the faults detected in the above processing have a value meeting a preset target fault detection rate (step S156). If so, the pattern merging means 13 merges the test patterns 12 generated by the random test pattern generating means 3 and ATG means 10 to output them as an output pattern 14, and the ATG means 10 outputs as the output undetected fault information 15 information on the faults that have not been used to generate the test patterns (step S157).

On the other hand, if it is determined in step S156 that the target fault detection rate has not been met, the process determines whether the processing has been finished for all partial circuits (step S158). If not, the process returns to step S152.

If it is determined at step S158 that the processing has been finished for all partial circuits, then the process detects whether there is any deferred list stored in the deferred-list storage means 8 (step S159). If there is no deferred list stored, the process returns to step S157.

If the process detects at step S159 that there are deferred lists stored in the deferred-list storage means 8, the fault detection difficulty circuit processing means 9 subsequently sorts the deferred lists (partial circuits) starting with the one with the smallest number of faults (step S160). This is because the number of faults remaining after the generation of random test patterns can be used as an index indicating whether the circuit is configured to allow faults therein to be detected easily. Thus, if there are a plurality of deferred partial circuits, this sorting enables these circuits to be sequentially processed starting with the one configured to allow faults therein to be detected most easily.

Next, the fault detection difficulty circuit processing means 9 selects the faults corresponding to the partial circuit from the undetected fault list for the entire circuit contained in the undetected fault information 4, and compares the number of these faults with the number of faults that must be detected in order to allow the fault detection rate for the entire circuit to reach the target value. Thus, the target fault detection rate of the partial circuit is calculated (hereafter referred to as the "partial-circuit target fault detection rate) (step S161).

Next, the ATG means 10 automatically generates a test pattern used to detect faults in the circuit, based on the partial-circuit target fault detection rate calculated in step S161 and the partial-circuit and fault information 6 output from the partial-circuit creating means 5 (step S162).

The test pattern generated in step S162 is output as the pattern 12, and the defects that were not used to generate the test pattern in step S155, that is, undetected faults, are output as the undetected fault information 4.

Subsequently, it is determined whether the fault detection rate of the partial circuit meets its target fault detection rate (step S163), and if so, the process returns to step S157.

On the other hand, if it is determined at step S163 that the target fault detection rate of the partial circuit has not been met, then the process determines whether the deferred-list storage means 8 is empty (step S164) If so, the process returns to step S157; otherwise, the process returns to step S161.

In this manner, the processing in steps S161 to S164 is carried out each time the ATG means 10 in one of the CPUs used for test pattern generation finishes the automatic generation of a test pattern, and continues until the fault detection rate of one of the partial circuits reaches its target defect detection rate or there is no longer any deferred list (partial circuit) stored in the deferred-list storage means 9.

Figure 19:
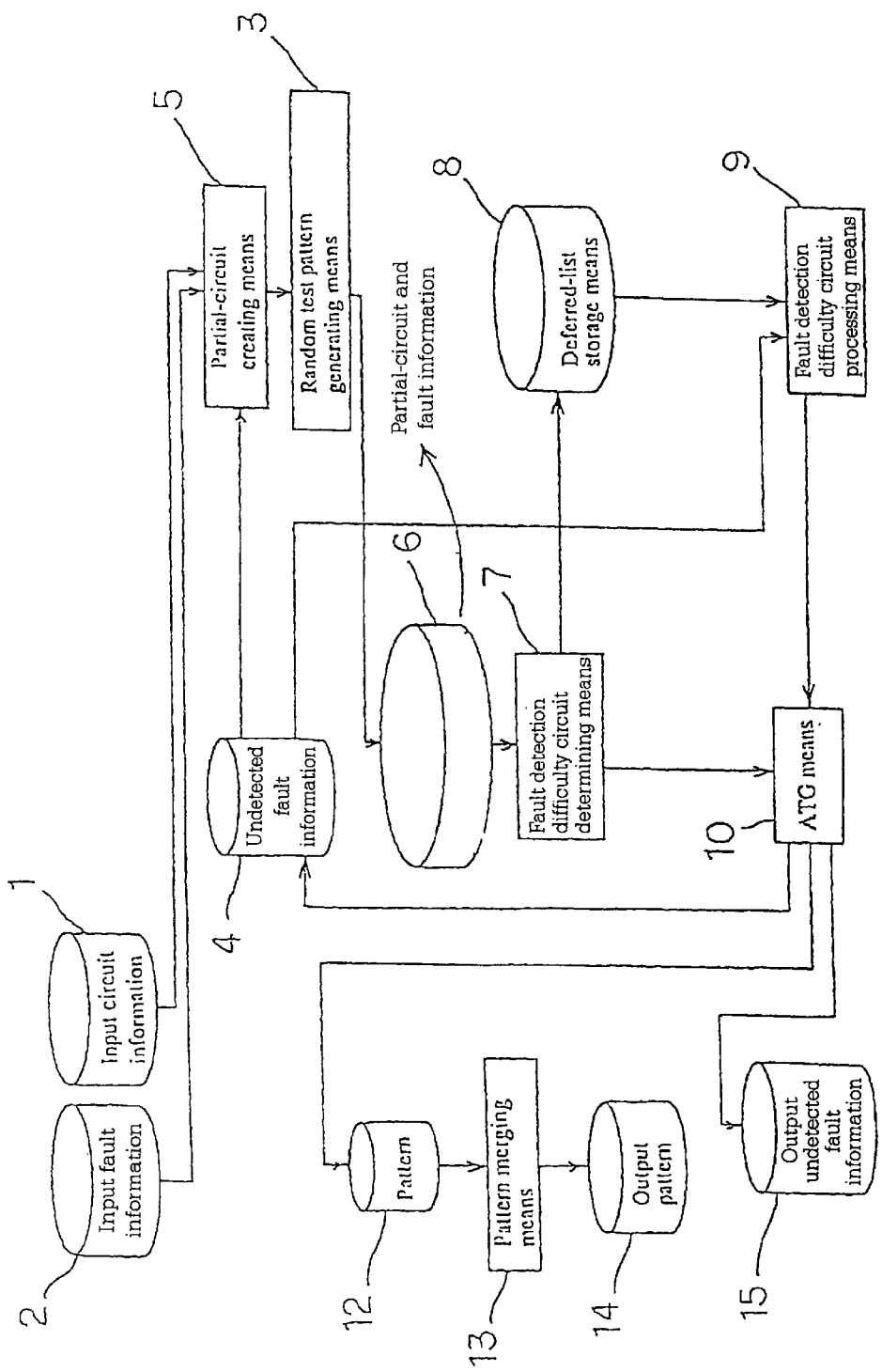
FIG. 19 is a block diagram showing a fifth embodiment of a test pattern generation system according to this invention.

FIG. 19 is a block diagram showing a fifth embodiment of a test pattern generation apparatus for logic circuit according to this invention.

This embodiment differs from fourth embodiment only in that is after the partial-circuit creating means 5 has created partial circuits, the random test pattern generating means 3 generates a random test pattern, as shown in FIG. 19. The configuration of this embodiment is otherwise the same as in the fourth embodiment.

Even if random test patterns are generated after partial circuits have been created as shown in this embodiment, the same effects as in the fourth embodiment can be obtained because the number of faults that have not been used to generate random test patterns is used as an index indicating whether faults in the circuit can be detected easily.

A sixth embodiment will now be described below wherein deferred lists are processed by dividing faults.

Figure 20:
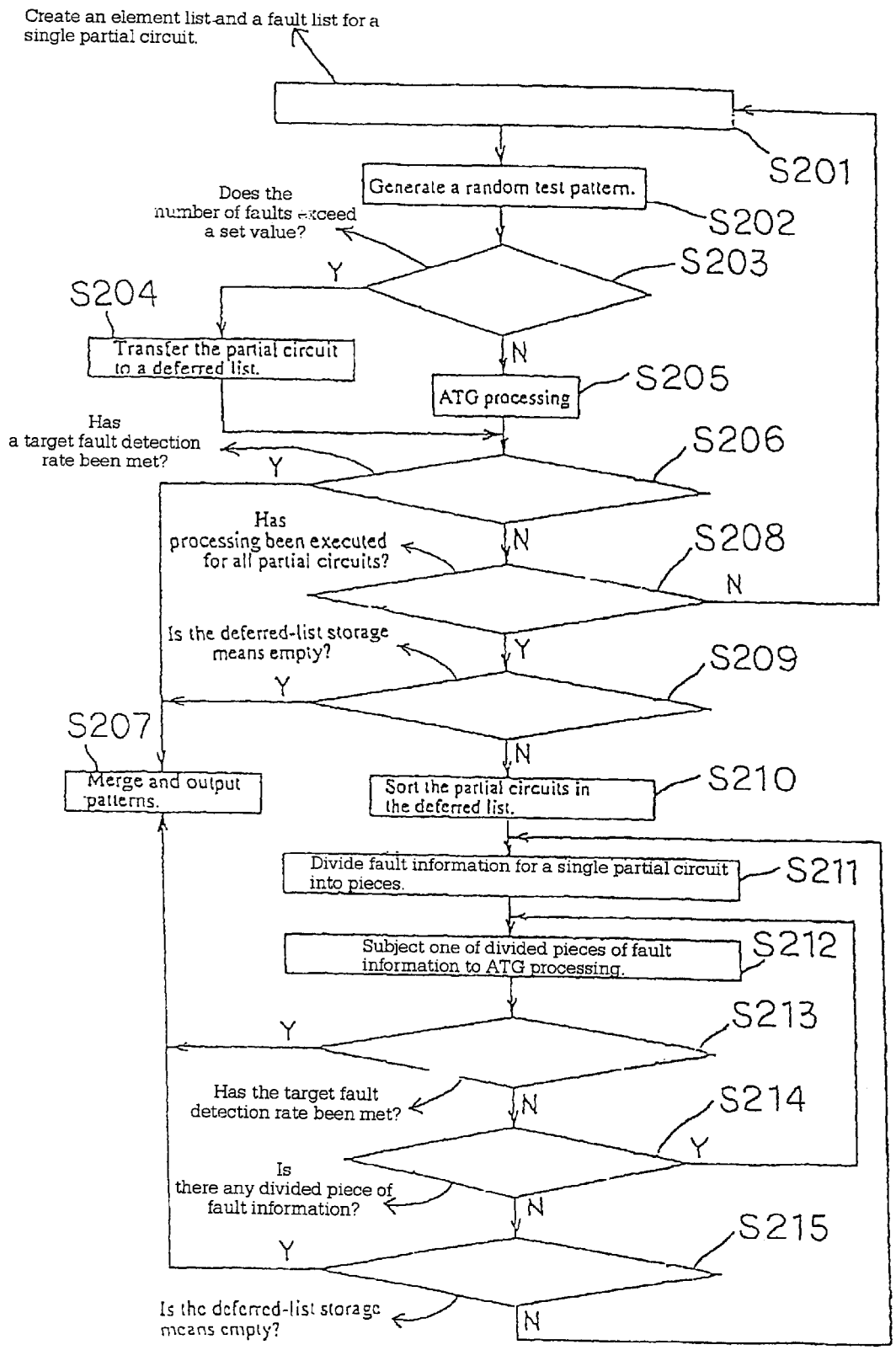
FIG. 20 is a flowchart showing a sixth embodiment of a method of test pattern generation according to this invention.

FIG. 20 is a flowchart showing a sixth embodiment of a method of test pattern generation according to this invention. The fault division refers to a method for dividing faults into groups to provide one group at a time instead of simultaneously providing all the faults for processing by a single circuit. If distributed processing is used for fault division, the same circuit is provided for each of a plurality of CPUs and each group of faults which are divided into several groups.

First, a circuit for ATG processing is divided into partial circuits the number of which is larger than that of the CPUs to generate the partial circuits, and information on faults that can be detected in the partial circuits is generated (step S201).

Next, random numbers are used to generate a random pattern, and fault simulation is executed to detect faults using the generated random pattern and to develop information on those faults among the input fault information 2 that have not been detected. Then, a fault pattern detected by the fault simulation is used as a test pattern (step S202). The detected faults are excluded from the subsequent pattern generation.

Next, the process determines whether the number of faults in a partial circuit is larger than a predetermined value (step S203)

By determining whether the number of faults in the partial circuit is larger than a predetermined value, it can be determined whether faults in the partial circuit can be detected relatively easily. In general, circuit faults cannot be detected easily when input data is branched to a plurality of gates while these data are combined into one at the output. Fault detection is still more difficult in a circuit in which each branched data input is further branched. A value used to determine whether it is difficult to detect faults in a circuit may be predetermined, but is normally set based on the ratio of the number of faults detected by the random test pattern generating means to the number of faults defined for the entire circuit.

If it is determined at step S203 that the number of faults in the partial circuit exceeds a predetermined value, the fault information for the partial circuit is output as a deferred list and then stored in the deferred-list storage means (step S204).

On the other hand, if it is determined at step S203 that the number of faults in the partial circuit is smaller than or equal to the predetermined value, a test pattern used to detect faults in the circuit is automatically generated based on the circuit configuration of a pattern for faults (step 205).

Subsequently, it is determined whether the faults detected in the above processing have a value meeting a preset target fault detection rate (step S206). If so, the test patterns 12 generated in steps S202 and S205 are merged together (step S207).

If it is determined in step S206 that the target fault detection rate has not been met, the process determines whether the processing has been finished for all partial circuits (step S208). If not, the process returns to step S201.

If it is determined at step S208 that the processing has been finished for all partial circuits, then the process detects whether there is any deferred list stored in the deferred-list storage means (step S209). If there is no deferred list stored, the process returns to step S207.

If the process detects at step S209 that there are deferred lists stored in the deferred-list storage means, the deferred lists (partial circuits) are sequentially sorted starting with the one with the smallest number of faults (step S210).

Next, the faults in the single partial circuit are randomly divided into groups (step S211), and each group of divided faults is passed to an idle one of the CPUs used to test pattern generation. A test pattern is then generated by each of the CPUs (step S212).

Subsequently, it is determined whether the faults detected in the above processing have a value meeting a preset target fault detection rate (step S213). If so, the process returns to step S207.

On the other hand, if it is determined at step S213 that the target fault detection rate has not been met, the process detects whether there are any divided faults that have not been used to generate the test patterns (step S214). If so, the process returns to step S212.

If it is detected at step S214 that there are no faults that have not been used to generate the test patterns, the process detects whether there is any deferred list stored in the deferred-list storage means (step S215). If there is no deferred list stored, the process returns to step S207, and otherwise, the process returns to step S212.

The use of fault division for processing deferred lists as shown in this embodiment has the following effects.

In distributed processing using circuit division, the same fault may be simultaneously handled by a plurality of CPUs, but time is wasted if an attempt is made to simultaneously process the same fault in two circuits, especially with faults which cannot be detected easily.

Consequently, processing using deferred lists has a very large overhead because the time required to detect one fault in a deferred partial circuit is larger than that required to detect one fault in a partial circuit that is not deferred.

Processing deferred lists using fault division allows all CPUs to process the same circuit instead of different CPUs handling the same fault. This configuration avoids the overhead of different CPUs processing the same fault.

In addition, processing deferred lists using fault division is more efficient than the use of a single CPU to control the detection difficulty circuit located at the end of the sequence.

As described above, in accordance with the construction of this invention, the whole of a logic circuit is divided into a plurality of partial circuits for which test patterns are generated independently of each other. Hence the process of automatic test pattern generation and simulation of fault detection therewith is easy to distribute among a plurality of processors.

Furthermore, if index information is attached to the input terminals, the shared input terminals are made one based on the index information when the RTG test patterns according to the respective partial circuits are merged, so the merging of the RTG test patterns can be easily performed.

Furthermore, in this invention, the partial-circuit and fault information is created by the partial-circuit creating means, and the fault information for a partial circuit is output as a deferred list if the number of faults in the partial circuit is larger than a predetermined value. The ATG means then generates test patterns based on the fault information for the partial circuits other than the one whose fault information has been output as the deferred list, and then based on the fault information for the partial circuit output as the deferred list. Thus, in order to finish the fault detection processing when a predetermined target fault detection rate is reached, if the target fault detection rate is reached before a partial circuit that is not configured to allow faults to be detected easily is processed, this partial circuit need not be processed, thereby substantially reducing the processing time required for ATG using circuit division.

In addition, if the same fault that should have been processed in a partial circuit that is not configured to allow faults to be detected easily, is processed in a partial circuit that is configured to allow faults to be detected easily, the processing is first executed for the partial circuit faults which can be detected easily in order to detect faults therein, which are then excluded from the subsequent test pattern generation. As a result, the processing is not executed for the partial circuit faults which cannot be detected easily and which have been placed in a deferred list, thereby reducing the processing time required for the entire circuit division distributed ATG.

In addition, the number of faults that must be detected in a partial circuit placed in a deferred list does not necessarily indicate all of the corresponding undetected fault list, so the number of faults for processing can be reduced by calculating and specifying a fault detection rate required for this partial circuit.

While preferred embodiments of the present invention have been described, it is to be understood that the invention is to be defined by the appended claims when read in light of the specification and when accorded their full range of equivalent.

What is claimed is:

1. A method of generating test patterns for a logic circuit, comprising the steps of:
   (a) generating a random test pattern for detecting at least one fault in a logic circuit;
   (b) extracting a plurality of partial circuits from said logic circuit; and
   (c) generating an algorithmic test pattern for each of said plurality of partial circuits for detecting faults other than said at least one fault detected in step (a).

2. The method of claim 1, wherein step (a) is repeated until fault detection is saturated.

3. The method of claim 1, wherein step (c) is repeated until an actual fault detection rate of said logic circuit reaches a target fault detection rate of said logic circuit.

4. The method of claim 1 further comprising the step of:
   (d) merging test patterns generated in step (a) and generated in step (c), and outputting a merged pattern as a test pattern of said logic circuit.

5. The method of claim 1, wherein step (b) is performed after step (a).

6. The method of claim 1, wherein step (b) is performed before step (a).

7. The method of claim 1, wherein step (a) comprises the steps of:
   (a1) generating a random pattern for providing input terminals of said logic circuit,
   (a2) simulating whether said random pattern can detect a fault of said logic circuit, and (a3) adopting said random pattern as said random test pattern if said random pattern can detect said fault of said logic circuit.

8. The method of claim 7, wherein said random pattern is a pattern for providing all input terminals of said logic circuit, and wherein step (a2) is performed for each of said plurality of partial circuits.

9. The method of claim 1, wherein step (b) comprises the steps of:

(b1) selecting an output terminal of said logic circuit, (b2) tracing fanin gates by turns from said output terminal toward input terminals of said logic circuit, (b3) extracting funin gates traced from said output terminal as one of said plurality of partial circuits, and (b4) repeating steps (b1) to (b3) concerning each of said output terminals of said logic circuit.

10. The method of claim 9, wherein step (b) further comprises the steps of:

(b5) sorting said plurality of partial circuits based on the number of gates, and (b6) merging said plurality of partial circuits within the limits of the maximum gate numbers of said plurality of partial circuits.

11. The method of claim 1, wherein step (c) comprises the steps of:

(c1) determining whether each of said partial circuits is a fault detection difficulty circuit based on fault detection result in step (a) of each of said plurality of partial circuits;

(c2) generating an algorithmic test pattern for each of said plurality of partial circuits other than said fault detection difficulty circuits; and (c3) generating an algorithmic test pattern for each of said fault detection difficulty circuits;

wherein step (c2) is repeated until an actual fault detection rate of said logic circuit reaches a target fault detection rate of said logic circuit; and wherein step (c3) is performed only if said actual fault detection rate of said logic circuit does not reach a target fault detection rate of said logic circuit.

12. The method of claim 11, wherein determination in step (c1) is performed based on undetected fault numbers of each of said plurality of partial circuits.

13. The method of claim 11, wherein determination in step (c1) is performed based on a fault detection rate of each of said plurality of partial circuits.

14. The method of claim 11, wherein step (c2) comprises generating algorithmic test patterns for a plurality of partial circuits simultaneously by using a plurality of processors; and wherein step (c3) comprises generating algorithmic test patterns for a plurality of faults of one fault detection difficulty circuit simultaneously by using a plurality of processors.

15. A system for generating logic circuit test patterns, comprising:

random test pattern generating means for generating a random test pattern, and for executing fault simulation to detect at least one fault of a logic circuit based on said random test pattern;

partial circuit creating means for extracting a plurality of partial circuits from said logic circuit;

algorithmic test pattern generating means for generating a test pattern for each of said plurality of partial circuits for detecting faults other than said fault detected by said random test pattern; and pattern merging means for merging test patterns generated by said random test pattern generating means and argorithmic test pattern generating means.

16. The test pattern generation system of claim 15, wherein said random test pattern is a test pattern for all of said logic circuit.

17. The test pattern generation system of claim 15, wherein said random test pattern generating means generates said random test pattern for each of said partial circuits.

18. The test pattern generation system of claim 15, wherein said random test pattern generating means generates said random test pattern as a test pattern for all of said logic circuit, and executes fault simulation for each of said partial circuits.

19. The test pattern generation system of claim 15, further comprising:

fault detection difficulty circuit determining means for determining whether each of said partial circuits has difficult to detect faults; and wherein said argorithmic test patten generating means is controlled to generate said partial circuits in sequence based on said fault detection difficulty circuit determining means.

20. A computer readable medium having a test pattern generation program recorded thereon for performing the following steps when such program is executed on a test pattern generation system:

(a) generating random test patterns for detecting at least one fault of a logic circuit;

(b) extracting a plurality of partial circuits from said logic circuit;

(c) generating an algorithmic test pattern for each of said plurality of partial circuits for detecting faults other than said fault detected in step (a); and (d) merging test patterns generated in step (a) and generated in step (c), and outputting a merged pattern as a test pattern of said logic circuit.

21. The computer readable medium of claim 20, wherein step (a) comprises the steps of:

(a1) generating a random pattern for providing input terminals of said logic circuit, (a2) simulating whether said random pattern can detect a fault of said logic circuit, and (a3) adopting said random pattern as said random test pattern if said random pattern can detect said fault of said logic circuit.

22. The computer readable medium of claim 21, wherein said random pattern is a pattern for providing all input terminals of said logic circuit, and wherein step (a2) is performed for each of said plurality of partial circuits.

23. The computer readable medium of claim 20, wherein step (b) comprises the steps of:

(b1) selecting an output terminal of said logic circuit, (b2) tracing fanin gates by turns from said output terminal toward input terminals of said logic circuit, (b3) extracting funin gates traced from said output terminal as one of said plurality of partial circuits, and (b4) repeating steps (b1) to (b3) concerning each of said output terminals of said logic circuit.

24. The computer readable medium of claim 23, wherein step (b) further comprises the steps of:
- (b5) sorting said plurality of partial circuits based on the number of gates, and
- (b6) merging said plurality of partial circuits within the limits of the maximum gate numbers of said plurality of partial circuits.

25. The computer readable medium of claim 20, wherein step (c) comprises the steps of:
- (c1) determining whether each of said partial circuits is a fault detection difficulty circuit based on fault detection result in step (a) of each of said plurality of partial circuits;
- (c2) generating an algorithmic test pattern for each of said plurality of partial circuits other than said fault detection difficulty circuits; and
- (c3) generating an algorithmic test pattern for each of said fault detection difficulty circuits;

wherein step (c2) is repeated until an actual fault detection rate of said logic circuit reaches a target fault detection rate of said logic circuit; and wherein step (c3) is performed only if said actual fault detection rate of said logic circuit does not reach a target fault detection rate of said logic circuit.

26. The computer readable medium of claim 25, wherein determination in step (c1) is performed based on undetected fault numbers of each of said plurality of partial circuits.

27. The computer readable medium of claim 25, wherein step (c2) comprises generating algorithmic test patterns for a plurality of partial circuits simultaneously by using a plurality of processors; and wherein step (c3) comprises generating algorithmic test patterns for a plurality of faults of one fault detection difficulty circuit simultaneously by using a plurality of processors.

* * * * *